US006207266B1

(12) United States Patent
Kanbara et al.

(10) Patent No.: US 6,207,266 B1
(45) Date of Patent: Mar. 27, 2001

(54) ELECTROMAGNETICALLY SHIELDING BONDING FILM

(75) Inventors: Hisashige Kanbara; Akishi Nakaso, both of Oyama; Minoru Tosaka, Shimodate, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 08/975,649

(22) Filed: Nov. 21, 1997

(30) Foreign Application Priority Data

| Jun. 3, 1997 | (JP) | 9-145075 |
| Jun. 3, 1997 | (JP) | 9-145076 |
| Jun. 6, 1997 | (JP) | 9-149208 |

(51) Int. Cl.$^7$ .................................................. H05K 9/00
(52) U.S. Cl. .................. 428/323; 428/328; 174/35 R; 422/186.02; 361/682
(58) Field of Search ................................... 428/323, 328; 174/35 R; 422/186.02; 361/682

(56) References Cited

FOREIGN PATENT DOCUMENTS

| 62-57297 | 3/1987 | (JP) . |
| 1-170098 | 7/1989 | (JP) . |
| 1-278800 | 11/1989 | (JP) . |
| 2-52499 | 2/1990 | (JP) . |
| 3-35284 | 2/1991 | (JP) . |
| 5-269912 | 10/1993 | (JP) . |
| 5-283889 | 10/1993 | (JP) . |
| 5-323101 | 12/1993 | (JP) . |
| 5-327274 | 12/1993 | (JP) . |

*Primary Examiner*—Stevan A. Resan
(74) *Attorney, Agent, or Firm*—Dickstein Shapiro Morin & Oshinsky, LLP

(57) ABSTRACT

Provided is bonding film in the form of web which has a high electromagnetic shielding effect for electromagnetic radiation from the front surface of a display device, and other favorable properties such as an infrared blocking property, a transparency, a invisibility and a favorable bonding property. The bonding film typically includes base film, a geometrically patterned electroconductive layer placed over the base film so as to achieve an aperture ratio of 80% of more, and a bonding layer for attaching the assembly to an object. The film may be applied to the surface of a transparent sheet member for the convenience of handling, and such an assembly has a symmetric structure so that the warping of the assembly may be minimized. The bonding film may be interposed between a pair transparent base sheets, or the bonding film may be applied over two sides a transparent base sheet. The assembly may further include an infrared blocking layer and an anti-glare layer.

52 Claims, No Drawings

ELECTROMAGNETICALLY SHIELDING BONDING FILM

TECHNICAL FIELD

The present invention relates to a method for making electromagnetic shielding bonding film for shielding electromagnetic radiation which may be produced from the front surfaces of CRT, PDP (plasma display panel), liquid crystal, EL and other display devices. The present invention also relates to bonding film which is capable of shielding electromagnetic radiation from the front surface of such display devices as CRT, PDP (plasma display), LCD, and EL, and a display device and an electromagnetic shielding assembly using such film.

BACKGROUND OF THE INVENTION

Recently, with the increase in the use of various electric and electronic appliances, problems of electromagnetic noises or interferences (EMI) have been on the increase. Such noises may be generally classified into conduction noises and emission or radiation noises. The use of noise filters is a typical measure against conduction noises. As for radiation noises, it is necessary to electromagnetically insulate a prescribed space. To this end, the appliance may be enclosed in a metallic or otherwise electroconductive casing, a metallic plate may be placed between the two circuit boards, or metallic foil may be wrapped around the cable. These measures may provide an adequate electromagnetic shield for the circuit or the power source block, but are unsuitable for shielding electromagnetic radiation which may be produced from the front surface of a display device such as a CRT or a PDP because such measures require an opaque material layer to be placed in front of the display device.

Methods for providing both an electromagnetic shielding effect and a transparency have been previously proposed (see Japanese patent laid open publications Nos. 1-278800 and 5-323101) which are based on forming electroconductive thin film over the surface of a transparent base member by vapor depositing metal or metal oxide.

There have also been proposed electromagnetic shielding materials having highly electroconductive fibers embedded in a transparent base material layer (see Japanese patent laid open publications Nos. 5-327274 and 5-269912), electromagnetic shielding materials having electroconductive resin material containing metallic powder or the like directly deposited or printed on a transparent base board (see Japanese patent laid open publications Nos. 62-57297 and 2-52499), and an electromagnetic shielding material having a transparent resin layer formed over a transparent base board such as polycarbonate board having the thickness of approximately 2 mm, and a copper layer of a mesh pattern formed over the resin layer by electroless plating (see Japanese patent laid open publication No. 5-283889).

According to the methods of forming a thin electroconductive layer by vapor depositing metal or metal oxide onto a transparent base board which were proposed in Japanese patent laid open publications Nos. 1-278800 and 4-323101 and purported to achieve both an electromagnetic shielding capability and a transparency, if the thickness of the electroconductive layer is reduced to a sufficient level (a few hundred Å to 2,000 Å), the surface resistance of the electroconductive layer becomes so large than the shielding effect for the frequency range of 1 MHz to 1 GHz will be less than 20 dB which is significantly lower than the required level of 30 dB or more.

As for the electromagnetic shielding material consisting of a transparent base member having electroconductive fibers embedded therein such as those proposed in Japanese patent laid open publications Nos. 5-327274 and 5-269912, a sufficiently high electromagnetic shielding effect of 40 to 50 dB can be achieved for the frequency range of 1 MHz to 1 GHz, but the fiber diameter which is required for regularly arranging the electroconductive fibers so as to achieve such a shielding effect becomes as large as 35 $\mu$m, and the fibers are so visible (which is referred to as "visibility" hereinafter) that the shielding material is quite unfit for application to display devices. In the case of the electromagnetic shielding material made by directly printing electroconductive ink containing metallic powder or the like on a transparent base board, similarly, the line width is no less than 100 $\mu$m due to the limitation of printing precision so that the visibility makes the material unsuitable. As for the shielding material formed by forming a transparent resin layer over a transparent base board made of a polycarbonate plate or the like having a thickness in the order of 2 mm, and forming a copper mesh pattern thereon by electroless plating, the surface of the transparent base board is required to be roughened or made coarse so as to achieve a sufficient adhesive power for the electroless plating. This roughening process requires the use of toxic oxidants such as chromic acid and permanganate acid, and can produce a desired result only when the base board is made of ABS resin. According to this method, even when an electromagnetic shielding effect and a transparency are both achieved, the thickness of the transparent base board cannot be reduced to a sufficient level so that the material is not suited to be formed into a sufficiently thin film or web. If the transparent base board has a significant thickness, as it cannot be closely attached to the surface of the display device, there will be a leakage of electromagnetic radiation. Also, in regard to the manufacturing process, because the shielding material cannot be put into the form of rolls, the material tends to be undesirably bulky and the unsuitability of the material to automation causes an increase in the production cost.

The electromagnetic radiation from the front surface of the display device that needs to be shielded is not limited the electromagnetic radiation in the frequency range of 1 MHz to 1 GHz that has to be reduced by 30 dB or more, but the infrared radiation in the wavelength range of 900 to 1,100 nm is also required to be blocked as it interferes with VTR equipment.

In addition to a favorable transparency for visible light, the material is required to have a favorable bonding property which allows it to be closely attached to the display surface so as to effectively shut off electromagnetic radiation, and to achieve a invisibility which makes the presence of the shielding material unnoticeable to the viewer. The bonding property includes the capability of the material to be attached to the surface of any one of a number of widely used polymer plate materials as well as to the surface of glass at a relatively low temperature, and to continue to maintain the close contact with the material over extended periods of time. However, such desirable material that can be formed into web or a roll, and which can sufficiently meet the requirements of the electromagnetic shielding effect, the infrared radiation blocking effect, the transparency, the invisibility, and the bonding property has not been hitherto available.

The part of the surface of the transparent plastic base member from which the electroconductive material has been removed presents an irregular surface because the surface was deliberately formed into an irregular surface in order to increase the adhesion force or because the marks of the reverse surface of the electroconductive material were imprinted on the surface of the transparent plastic base member. Therefore, the irregular reflection on the surface may damage the transparency of the base member, but by evenly applying a resin material layer, having a refraction index close to that of the base member, over such an irregular surface, the irregular reflection is minimized so that the transparency of the base member may be restored. The electroconductive material geometrically patterned on the surface of the transparent plastic base member has such a fine line width that it is practically invisible to naked eyes. The large line spacing also contributes to the invisibility of the electroconductive material.

Also, it is believed that, because the pitch of the geometric pattern is sufficiently smaller than the wavelength of the electromagnetic radiation that is desired to be shielded, a superior shielding performance can be achieved.

Also, the PDP panel, which is one type of flat panel, requires its front surface to be free from any warping. To control such a warping, it is preferable to use a symmetric structure, and is conceivable to attach a pair of transparent plastic sheets onto either side of a bonding agent layer. However, because the front panel of a display device is normally required to have a thickness of 2 to 5 mm in view of the possibility of breaking the glass and the ease of handling, a pressing process is necessary in view of the thermal conduction to the bonding agent in order to produce such an assembly. Additionally, the front panel of the display requires an anti-glare processing or an anti-reflection processing, it is required to be carried out directly on the transparent plastic base sheet, and the production process must be carried out as a batch process. For these two reasons, the production of such an assembly involves the problem that a continuous production process is not possible, and hence the production cost would be undesirably high.

BRIEF SUMMARY OF THE INVENTION

In view of such problems of the prior art, a primary object of the present invention is to provide electromagnetic shielding bonding film which may be applied to a member or an area where electromagnetic shielding and optical transparency are both required.

A second object of the present invention is to provide electromagnetic shielding bonding film which is easy to handle and economical to manufacture.

A third object of the present invention is to provide electromagnetic shielding bonding film which has a favorable optical properties such as high visible light transparency, invisibility of electroconductive shielding material, and freedom front image distortion.

A fourth object of the present invention is to provide electromagnetic shielding bonding film which can be conveniently applied to a wide range of display devices and electromagnetic shielding assemblies.

A fifth object of the present invention is to provide an electromagnetic shielding assembly incorporating such electromagnetic shielding bonding film which is highly effective in shutting off electromagnetic radiation but highly transparent to visible light.

A sixth object of the present invention is to provide an electromagnetic shielding assembly which is capable of blocking infrared radiation as well.

A seventh object of the present invention is to provide an electromagnetic shielding assembly which is capable of controlling spurious reflection and glare on the surface of the assembly.

According to the present invention, these and other objects can be accomplished by providing a method for making electromagnetic shielding bonding film, comprising the steps of: forming geometrically patterned electroconductive material over substantially transparent base film, the geometric pattern providing an aperture ratio of 80% of more; coating a bonding agent composition over a part of an entirety of at least one side of the base film, the bonding agent composition having a refractive index similar to that of the base film; the base film being prepared as a roll web, and at least most of the steps are carried out in a continuous manner.

Thus, bonding film having a favorable electromagnetic shielding capability and a high visible light transparency can be produced in an efficient and economical manner. The production process may further comprise the step of forming an infrared blocking layer by using an infrared blocking composition having an absorption ratio of 50% or more for infrared light of 900 to 1,100 nm in wavelength at least on one side of the base film, and this process can also be implemented a a substantially continuous operation.

The geometric patterned electroconductive material may be formed in an economical and precise manner by etching. To achieve a favorable transparency of the produced bonding film, the bonding agent composition should have a refractive index of 1.45 to 1.60 which is similar to that of most widely used plastic or otherwise transparent material suitable for base film such as polyethylene-terephthalate. To the end of reducing the number of production steps, and simplify the structure of the bonding film, the infrared blocking layer may be incorporated in the coating of the bonding agent composition.

To achieve a desired electromagnetic shielding performance without impairing the visible light transparency and the view angle, the geometric patterned electroconductive material may have a line width 40 $\mu$m or less, a line spacing of 200 $\mu$m or more, and a line thickness of 40 $\mu$m or less. Preferably, the geometric patterned electroconductive material layer consists of a member selected from a group consisting of copper, aluminum and nickel layer, and the geometric patterned electroconductive material has a thickness of 3 to 40 $\mu$m. To achieve a favorable attachment between the electroconductive material and the base film, a surface of the transparent base film carrying the electroconductive material and/or the reverse surface of the electroconductive material layer may consist of a coarse surface having a surface roughness of 1 $\mu$m or or. To achieve a favorable electromagnetic shielding performance and a high contrast image transmission, the electroconductive material may consist of copper which has a darkened surface. To the end of even more effectively shielding a magnetic field, the electroconductive material may consist of paramagnetic metallic material.

The present invention provides bonding film which has a highly optically transparent and electromagnetically shielding property, by combining substantially transparent base film; geometrically patterned electroconductive material formed at least on one side of the transparent base film; a bonding layer placed at least partly at least on one side of the base film; wherein the geometric patterned electroconductive material has a line width of 40 $\mu$m or less, a line spacing of 200 $\mu$m or more, and a line thickness of 40 $\mu$m or less; and a difference in refraction index between the transparent base film and the bonding layer is 0.14 or less. When a bonding agent layer is interposed between the transparent base film and the bonding layer, and differences in refraction index between the bonding agent layer and the transparent base film, and between the bonding agent layer and the bonding layer should be 0.14 or less so that a desired transparency may be achieved.

The present invention additionally provides an electromagnetic shielding assembly, comprising: electromagnetic shielding film; and a pair of substantially transparent base sheets attached to either side of the transparent plastic film, the plastic base sheets having a substantially identical thickness. This assembly is particularly suitable for use on the front surface of a display device. In particular, because of the symmetrically laminated arrangement, the assembly is free from any warping. Alternatively, the electromagnetic shielding assembly may comprise a substantially transparent base sheet; substantially transparent base film placed on each side of the base sheet; the base film placed at least on one side of the base sheet consisting of electromagnetic shielding film. The transparent base sheet is preferably made of polymethylmethacrylate (PMMA). In such assemblies also, by controlling the difference between adjoining transparent members such as base sheet, base film, and bonding layers so as to be at least less than 0.14, it is possible to achieve a favorable visible light transparency.

When producing such assemblies, the temperature at which the lamination process should be carried out may be selected by taking into account Tg and the crosslinking/curing temperature of the bonding agent layer, and Tg of the transparent plastic base sheet. The temperature range of 100° C. to 300° C. is preferred. If the temperature is too low, the bonding may become insufficient. If the temperature is too high, the bonding agent may seep out, and the transparent plastic base sheet may deform.

The assembly of the present invention may be mounted on the front surface of a display device, or mounted on the cases for measuring instruments, measuring devices and manufacturing devices, and inspection windows for such cases as well as for protecting appliances and devices from electromagnetic radiation by being mounted on the cases for such appliances and devices, and windows for such cases that require to be transparent.

DETAILED DESCRIPTION OF THE PREFERRED EMBODIMENTS

Now the present invention is described in the following in more detail.

The plastic film as used in this application includes those made of polyesters such as polyethylene terephthalate (PET) and polyethylene naphthalate, polyolefins such as polyethylene, polypropylene, polystyrene and EVA, vinyl resins such as polyvinyl chloride and polyvinylidene chloride, polysulfone, polyethersulfone, polycarbonate, polyamide, polyimide, and acrylic resins which have a transmission factor of 70% or more for visible light. These materials may be used as a single layer or multi layers combining two or more layers. In view of transparency, heat-resistance, handling and cost, polyethylene terephthalate is particularly suitable. The thickness of the base material is preferably in the range of 5 to 200 $\mu$m. If the thickness is less than 5 $\mu$m, the handling is impaired. If the thickness is greater than 200 $\mu$m, the transmission factor of visible light diminishes. The thickness range of 10 to 100 $\mu$m is particularly preferable, and the thickness range of 25 to 50 $\mu$m is even more preferable.

The electroconductive metallic material as used in this application includes a material or an alloy of two or more selected from a group consisting of copper, aluminum, nickel, iron, gold, silver, stainless steel, tungsten, chromium and titanium or a combination thereof. In view of electroconductivity, suitability for circuit fabrication and cost, copper, aluminum and nickel are particularly suitable. The material preferably should be in the form of metallic foil having a thickness of 3 to 40 $\mu$m. If the thickness exceeds 40 $\mu$m, forming the fine lines becomes difficult, and the visible angle is reduced. If the thickness falls below 3 $\mu$m, the surface resistance increases to such an extent that the electromagnetic shielding effect may become inadequate. It is preferable if the electroconductive metallic material consists of copper having at least its surface darkened because a high contrast can be achieved. Also, the oxidation and fading of the electroconductive metallic material over time can be avoided. The darkening process can be carried outer either before or after the process of forming the geometric pattern, but is normally carried out after forming the geometric pattern in the manner well known in the art of printed circuit boards. For instance, the darkening process may consist of processing the metallic material in a water solution of sodium chlorite (31 g/liter), sodium hydroxide (15 g/liter), and trisodium phosphate (12 g/liter) for 2 minute at 95° C. It is desirable if the electroconductive metallic material consists of paramagnetic metal as it improves the magnetic shielding effect in addition to the shielding effect against an electric field.

Such electroconductive metallic material can be most easily brought into close contact with plastic film of the above described type by coating a bonding agent essentially consisting of acrylic or epoxy resin onto the electroconductive metallic material in the form of foil or the plastic film, and bonding these two material layers together via the bonding agent. When the thickness of the layer of the electroconductive metallic material is desired to be reduced, it can be achieved by one or a combination of two or more of the thin film forming methods selected from a group consisting of vacuum deposition, sputtering, ion plating, chemical vapor deposition, and electroless and electric plating. The film thickness of the electroconductive metallic material is preferably 40 $\mu$m or less. The film thickness is desired to be as small as possible for the performance of the electromagnetic shielding material because the visible angle becomes larger as the film thickness is reduced. It is therefore even more preferable if the film thickness is 18 $\mu$m or less. The plastic film layered by the electroconductive metallic material is required to be in the form of a continuous roll, and this means that both the foil of the electroconductive metallic material and the plastic film are preferably both in the form of continuous rolls. Bonding varnish or a bonding agent composition is evenly coated over the surface of the foil of the electroconductive metallic material, and after evaporating the solvent, the plastic film is laminated over the surface of the electroconductive metallic material by using a roller laminator to attach a plastic film to the foil of electroconductive metallic material. Alternatively, bonding varnish or a bonding agent composition is evenly coated over the surface of the plastic film, and after evaporating the solvent, the plastic film is laminated over the surface by using a roller laminator to attach the plastic film to the foil of electroconductive metallic material. The thus produced plastic film lined by the foil electroconductive metallic material is rolled onto a core tube which may be made of paper, plastic or metal.

The thus produced plastic film layered by the foil of the electroconductive metallic material is subjected to an etching process so as to form a geometric pattern and define an aperture ratio of 80% or more. The geometric pattern as used in this application may consist of a triangle such as right triangle, equilateral triangle and right-angled triangle, a rectangle such as square, oblong, parallelepiped and trapezoid; a polygon such as hexagon, octagon, dodecagon and icosahedron, a circle, an ellipsoid or a star shape, or a combination of these, and these individual patterns may repeat by themselves or two or more of these patterns may be combined. Triangles are most effective in terms of the electromagnetic shielding effect, but polygons having as many a side as possible are desirable in view of the transmission factor of visible light because of an increased aperture ratio.

The geometric pattern may be formed by the chemical etching process which is widely practiced in the field of printer circuit boards. This process comprises the step of applying resist ink over the surface of the electroconductive metallic material layer layered over the plastic film as a geometric pattern by screen printing. The application of resist ink may be carried out in a step-wise fashion, by sequentially shifting the area of resist ink application, and, if necessary, may be accompanied by a drying process. When the resist pattern is to be formed by using photosensitive resin film, the photosensitive resin film is layered over a layer of electroconductive metallic material which is in turn formed over the surface of plastic film, and photographically exposing the photosensitive resin film by placing a negative or positive photographic film, having the geometric pattern printed thereon, over the surface of the photosensitive resin film. The assembly is then photographically developed so as to form the geometrically patterned resist layer thereon, in a continuous manner. Thereafter, the plastic film having the layer of electroconductive metallic material carrying the geometrically patterned resist thereon is etched by passing it through a liquid etchant or by showering a liquid etchant. The assembly is then washed with water, and dried before it is finally wound into a continuous roll. Obviously, the process of forming the etching resist layer, and the etching process are desired to be carried out in a continuous manner in view of increasing the efficiency. It is effective, in view of increasing the processing efficiency, to mask the assembly with a chemical etching process, and wind the assembly as web (or a roll). It is also possible to use a geometrically patterned mask to selectively, photographically expose and develop a layer of photosensitive resin which is placed over the surface of transparent plastic film. Additionally, combining electroless plating and electric plating is also possible.

The line width of the geometric pattern should be 40 μm or less, the line spacing should be 200 μm or more, and the line thickness should be 40 μm or less. In view of transmission factor for visible light, it is even more preferable if the line width is 25 μm or less, the line spacing is 250 μm or more, and the line thickness is 18 μm or less. As the line spacing increases, the aperture ratio becomes greater, and the transmission factor for visible light increases. When the assembly is applied to the front surface of a display device, the aperture ratio is required to be 80% or more, but an excessive aperture ratio leads to a reduction in the electromagnetic shielding performance, and the line spacing is desired to be 1 mm or less. When the geometric pattern is relatively complex, the line spacing may be defined by converting the open area of each repeating pattern unit into a square, and measuring the side of such a square.

The bonding agent layered over the geometric pattern should have a refraction index of 1.45 to 1.60. This is because the transmission factor of visible light diminishes when there is a large difference in refraction index between the plastic film and the bonding agent layer or between the bonding agent layer for attaching the electroconductive metallic layer to the plastic film and the surface bonding agent layer. If the refraction index is in the range of 1.45 to 1.60, the reduction in the transmission factor of visible light is insignificant, and a favorable result can be achieved. In particular, it is desirable if the difference in refractive index between the bonding agent layer for attaching the electroconductive metallic layer to the plastic film and the bonding agent layer applied to the surface of the patterned layer of the electroconductive metallic material is 0.14 or smaller. This is because if there is a significant difference between the plastic film and the surface bonding agent, or, when the plastic film is layered by a layer of electroconductive metallic material, between the plastic film and the bonding agent between the metallic layer and the plastic film, the transmission factor of visible light drops. Such a drop in the transmission factor can be favorably avoided if the difference in refraction index is 0.14 or less. The material for the bonding agent meeting such requirements includes bisphenol type A epoxy resin, bisphenol type F epoxy resin, tetrahydroxy-phenylmethane epoxy resin novolac epoxy resin, resorcin epoxy resin, polyalcohol/polyglycohol epoxy resin, polyolefin epoxy resin, alicyclic epoxy resin and bisphenol halide epoxy resin (which have refractive indices in the range of 1.55 to 1.60) when the plastic film consists of polyethylene phthalate (n=1.575, refraction index). In addition to epoxy resins, dienes such as natural rubber (n=1.52), polyisoprene (n=1.521), poly-1,2-butadiene (n=1.50), polyisobutane (n=1.505 to 1.51), polybutane (n=1.5125), poly-2-heptyl-1,3-butadiene (n=1.50), poly-2-t-butyl-1,3-butadiene (n=1.506) and poly-1,3-butadiene (n=1.515), polyethers such as polyoxy-ethylene (n=1.4563), polyvinyl-ethylether (n=1.454), polyvinyl-hexylether (n=1.4591) and polyvinyl-butylether (n=1.4563), polyesters such as polyvinyl-acetate (n=1.4665), and polyvinyl-propionete (n=1.4665), polyurethane (n=1.5 to 1.6), ethyl-cellulose (n=1.479), polyvinyl-chloride (n=1.54 to 1.55), polyacrylonitrile (n=1.52), polymethyacrylonitrile (n=1.52), polysulfide (n=1.6), phenoxy resin (n=1.5 to 1.6). These materials are suitable for achieving a favorable transmission factor for visible light.

When the plastic film is made of acrylic resin, in addition to the above listed materials, the bonding agent may consist of poly (metha) acrylic acid esters such as polyethyl-acrylate (n=1.469), polybutyl-acrylate (n=1.466), poly-2-ethylhexyl-acrylate (n=1.463), poly-t-butyl-acrylate (n=1.464), poly-3-ethoxypropyl-acrylate (n=1.465), polyoxycarbonyl-tetramethacrylate (n=1.465), polymethyl-acrylate (n=1.472 to 1.480), polyisopropyl-methacrylate (n=1.473), polydodecil-methacrylate (n=1.474), polytetradecil-methacrylate (n=1.475), poly-n-propyl-methacrylate (n=1.484), poly-3,3,5-trimethyl-cyclohexyl-methacrylate (n=1.484), polyethyl-methacrylate (n=1.485), poly-2-nitro-2-methylpropyl-methacrylate (n=1.487), poly-1,1-diethylpropyl-methacrylate (n=1.489), and polymethyl-methacrylate (n=1.489). Two or more these acrylic polymers may be copolymerized, or may be mixed together as required.

Copolymers of acrylic resin and other resin material may also be used, and they include epoxyacrylates, urethanacrylates, polyetheracrylates, and polyesteracrylates. In terms of bonding property, epoxyacrylates and polyetheracrylates are particularly desirable. Such epoxyacrylates include (metha)acrylic acid derivatives such as 1,6-hexandiol-diglycidylether, neopenthylglycol-diglycidylether, arylalcohol-diglycidylether, resorcinol-diglycidylether, diglycidylester adipate, diglycidylester phthalate, polyethyleneglycol-diglycidylesther, trimethylolpropane-triglycidylether, glycerin-triglycidylether, pentaerythritol-tetraglycidylether, and sorbitol-tetraglycidylether. Epoxyacrylates are effective in improving bonding property as they contain hydroxyl groups in their molecules, and these copolymers can be used either individually or in combination. The weight-average molecular weight of the main polymer in the bonding agent should be 1,000 or greater. If the molecular weight is less than 1,000, the cohesive force of the composition is so small that a satisfactory attachment to the object may not be achieved.

The crosslinking/curing agent for the bonding agent may consist of amines such as triethylenetramine, xylenediamine, N-aminotetramine, and diaminodiphenylmethane, anhydrides such as anhydrous phtalate acid, anhydrous maleic acid, anhydrous dodecyl-succinic acid, anhydrous pyromellitic acid, and anhydrous benzophenontetracarboxylic acid, diaminodiphenylsulfone, tris(dimethylaminomethyl)phenol, polyamide resins, dicyandiamide, and ethylmethylimidazol. These materials may be used individually or in combination. The added amount of the crosslinking/curing agent should be in the range 0.1 to 50 weight parts, or more preferably should be in the range of 1 to 30 weight parts for 100 weight parts of the above mentioned polymer. If the added amount is less than 0.1 weight parts, the crosslinking and curing becomes insufficient. However, if the added amount exceeds 50 weight parts, the crosslinking may become excessive, and the bonding property may be impaired as a result.

Diluting agents, plasticizers, oxidation preventing agents, fillers and adhesion improving agents may be added to the resin composition of the present invention. The resin composition serving as the bonding agent is applied over the surface of the plastic film in the form of web or a roll so as to cover a part of the surface or the entire surface of the plastic film carrying the geometrically patterned electroconductive metallic layer and after subjecting the assembly to the processes of drying the solvent, heating, and partial crosslinking/curing, the assembly is wound into a roll of the electromagnetic shielding bonding film according to the present invention. The process of applying the bonding agent having a refraction index in the range of 1.45 to 1.60 over a part of the surface or the entire surface of the base material layer can be carried out by using a coating machine such as a roll coater, a curtain coater or a gravure coater so as to achieve a uniform thickness. The solvent components in the bonding agent composition is removed by heating or the like so as to form a layer of the bonding agent over a part of the surface or the entire surface of the base material layer including the geometrically patterned layer of electroconductive metallic material. If necessary, the bonding agent layer may also be coated over the surface of the assembly opposite to the surface over which the bonding agent composition has been applied.

The method for forming the bonding resin composition having an infrared absorption ratio of 50% or higher for the frequency range of 900 to 1,100 nm may consist of adding organic infrared absorbing agents in the bonding agent composition. Such organic infrared absorbing agents may include metal oxides such as iron oxide, cerium oxide, tin oxide and antimony oxide, indium-tin oxide (which is referred to as ITO hereinafter), tungsten hexachloride, tin chloride, copper (II) sulfide, chromium-cobalt complex salt, thiol-nickel complex compound, aminium compounds, diimonium compounds (marketed by Nihon Kayaku KK), antraquinone compounds (SIR-114), metallic complex compounds (SIR-128, SIR-130, SIR-132, SIR-159, SIR-152, and SIR-162), phthalocyanine (SIR-103) (these are marketed by Mitsui Toatsu Kagaku KK). Alternatively, these compounds may be dispersed in binder resin which is then over the surface of the bonding agent composition or the reverse surface of the assembly so as to define an infrared absorbing layer. The infrared radiation which may emit from the display device may interfere with the operation of remote controls for other TVs, VTRs, ratios and personal computers using infrared, and providing such an Infrared Blocking layer prevents the remote control from failing to operate properly.

The compounds which are particularly effective in absorbing infrared radiation include such infrared absorbing agents as copper (II) sulfide, ITO, aminium compounds, di-imonium compounds, and metallic complex compounds. In case of infrared absorbing agents other than organic infrared absorbing agents, it is important to properly select the diameter of the primary particles. If the particle diameter is substantially larger than the wavelength of the infrared radiation, the blocking efficiency may be high, but the transparency drops because the irregular reflection by the surfaces of the particles cause a hazy appearance. If the particle diameter is excessively small, the shielding efficiency drops. The preferable range of the particle diameter is 0.01 to 5 $\mu$m, and an even more preferable range is 0.1 to 3 $\mu$m. The infrared absorbing agent is evenly dispersed in binder resins which may comprise epoxy resins such as bisphenol type A epoxy resin, bisphenol type F epoxy resin, and novolac type epoxy resin, diene resins such as polyisoprene, poly-1,2-butadiene, polyisobutane, and polybutane, polyacrylic acid ester copolymers such as ethylacrylate, butylacrylate, 2-ethylhexylacrylate, and t-butylacrylate, polyester resins such as polyvinylacetate, polyvinylpropionate, and polyolefin resins such as polyethylene, polypropylene, polystyrene, and EVA. The mixture ratio of the infrared absorbing agent should be preferably 0.01 to 10 weight parts, and more preferably 0.1 to 5 weight parts for 100 weight parts of the binder. If the mixture ratio is less than 0.01 weight parts, a required infrared absorbing ratio cannot be achieved. If the mixture ratio is greater than 10 weight parts, a required transparency cannot be achieved. These compounds are applied over the surface of the bonding agent composition which is geometrically defined on the surface of the assembly including plastic film and a electroconductive metallic layer placed over it or the reverse surface of the assembly to a thickness in the range of 0.01 to 10 $\mu$m. The applied layer of the composition including infrared absorbing compounds may be cured by using heat or UV.

It is also possible to directly mix the infrared absorbing compounds with the bonding agent composition. In such a case, the added amount of the infrared absorbing agent should be in the range of 0.01 to 5 weight parts for 100 parts of the polymer which forms the bonding agent in view of shielding performance and transparency.

The anti-reflection process as used in this invention means a process for increasing the transmission factor of visible light by controlling the reflection of visible light. The wavelength of minimum reflection is determined by the thickness of the coating layer, and the refraction index of the coated material as given by the following equation (Equation 1).

$$nd=(m+1/2)\lambda/2 \qquad (1)$$

where n is the refraction index, d is the thickness of the coating, $\lambda$ is the wavelength, and m is an integer 0, 1, 2, 3, . . . )

Because n is determined by the property of the material, the wavelength of minimum reflection (maximum transmission) can be selected by changing the thickness of the coating layer. The anti-reflection process may include a single-layer and multi-layer structures of material having different refraction indices from that of the transparent plastic film. In the case of the single-layer structure, the material having a larger refractive index than the transparent plastic film is selected. When the multi-layer structure having a favorable anti-reflection effect is selected, it is desirable to provide a layer of material having a larger refractive index than the transparent plastic film on the transparent plastic film, and laminate a layer of material over another in such a manner that the outer layer may have a larger refractive index than the adjoining inner layer. The materials for achieving such an anti-reflection property may be selected from any know materials having such a property, and, for instance, may include such dielectric materials as $CaF_2$, $MgF_2$, $NaAlF_6$, $Al_2O_3$, $SiOx$ (x=1 or 2), $ThF_4$, $ZrO_2$, $Sb_2O_2$, $Nd_2O_2$, $SnO_2$ and $TiO_2$. The refractive indices of these materials as well as the thickness of each layer are selected so that the above mentioned relation may hold. The anti-reflection layers may be formed by vacuum deposition, ion plating, sputtering and so on.

The anti-glare process as used in this invention means a process for preventing the flickering of the display, and the resulting fatigue of the viewer's eyes, and may be achieved by forming an anti-glare layer which is made of any known such materials, but preferably from inorganic silica. However, a hardened film of curable resin material containing inorganic silica dispersed and secured therein is preferred. Such curable resin material may include epoxy resins such as bisphenol type A epoxy resin, bisphenol type F epoxy resin, tetrahydroxy-phenylmethane epoxy resin, and novolac epoxy resin, diene resins such as polyisoprene, poly-1,2-butadiene, polyisobutane, and polybutane, polyacrylic acid ester copolymers such as ethyleneacrylate, butylacrylate, 2-ethyhexylacrylate, and t-butylacrylate, polyester resins such as polyvinyl-acetate, and polyvinyl-propionete, polyolefin resins such as polyethylene, polypropylene, polystyrene, and EVA, and silicone resins.

When forming such an anti-glare layer, first of all, silica particles are dispersed in crosslinking/curing resin material, and an anti-static agent, a polymerization initiator, a curing agent, a reaction promoting agent and other additives are added to the mixture as required. This mixture is dissolved in a solvent so as to achieve solid content of approximately 20 to 80 weight %. The silica particles are non-crystalline and porous, and typically consist of silica gel. The average particle diameter should be 30 μm or less, or more preferably in the range of 2 to 15 μm. Preferably, the content of the silica particles is 0.1 to 10 weight parts for 100 weight parts of the resin. If the silica content is too small, a desired anti-glare property may not be obtained. If the silica content is too large, the transmission factor of visible light and the film strength may be lost.

This compound may be applied to a surface of the transparent plastic film by any suitable means such as a gravure coater, a reverse coater, a spray coater or other known coating machines so that a dry film thickness of 5 to 30 μm may be achieved. The film, after drying with heat, may be cured and crosslinked by ultraviolet radiation, electron beam radiation or heating. The anti-glare layer consisting of film containing silica particles gives a favorable anti-glare property to the assembly when the transparent plastic film incorporated with this anti-glare layer is bonded on the surface of the transparent plastic base sheet. Also, because the anti-glare layer has such a high hardness that a favorable anti-scratch property is obtained, and the assembly is thereby made highly wear resistant.

Prior to the formation of such an anti-glare layer, the corresponding surface or the surface of the transparent plastic film may be subjected to such preliminary processing as corona discharge processing, plasma processing, sputter etching and other bonding facilitating measures so that the adhesive force between the transparent plastic film and the anti-glare layer may be increased.

According to the present invention, because the surface of the assembly from which the electronconductive metallic layer has been removed is deliberately turned into a coarse surface with the aim of improving the bonding property, and/or the marks of the reverse surface of the electroconductive metallic layer left on the surface of the assembly, the transparency is lost to a certain extent. However, by evenly applying a bonding agent, having a refraction index similar to that of the plastic film or that of the bonding agent for attaching the electromagnetic metallic material to the plastic film, onto such an irregular surface, irregular reflection can be minimized, and the transparency may be improved. Also, the geometric pattern of the electromagnetic metallic material layer placed over the plastic film has such a small line width that the geometric pattern would not be visible to naked eyes. The spacing between adjacent lines of the geometric pattern is so large that a virtually transparent appearance would be achieved. The pitch of the geometric pattern is so small in comparison to the wavelength of the electromagnetic radiation which is desired to be shielded that a favorable shielding capability would be achieved.

Thus, according to the method for making electromagnetic shielding bonding film, comprising the steps of: (a) removing electroconductive metallic material from plastic film, incorporated with an electroconductive metallic material layer, by etching so as to define a geometric pattern of the electroconductive metallic material layer, the geometric pattern providing an aperture ratio of 80% or more; (b) coating a bonding agent composition having a refractive index of 1.45 to 1.60 over a part or an entirety of a base material layer carrying the geometric pattern; and (c) coating a resin composition having an absorption ratio of 50% or more for infrared light of 900 to 1,100 nm in wavelength over the surface coated with the bonding agent composition or the opposite surface; the film being continually paid from a roll and wound back to a roll in each of the steps, because the manufacturing process can be carried out in a continuous manner in each step involving very little waste of material and energy, it is possible to manufacture a highly workable and high-quality electromagnetic shielding bonding film in a highly waste-free and efficient manner.

Also, according to the method for making electromagnetic shielding bonding film, comprising the steps of: (a) removing electroconductive metallic material from plastic film, incorporated with an electroconductive metallic material layer, by etching so as to define a geometric pattern of the electroconductive metallic material layer, the geometric pattern providing an aperture ratio of 80% or more; and (b) coating a resin composition having a refractive index of 1.45 to 1.60 and an absorption ratio of 50% or more for infrared light of 900 to 1,100 nm in wavelength over a part or an entirety of a base material layer carrying the geometric pattern; the film being continually paid from a roll and wound back to a roll in each of the steps, because the manufacturing process can be carried out in a continuous manner in each step involving very little waste of material and energy in a similar fashion, it is possible to manufacture a highly workable and high-quality electromagnetic shielding bonding film in a highly waste-free and efficient manner.

According to the present invention, the step of attaching the electroconductive metallic material to the plastic film, the step of geometrically patterning the electroconductive metallic material, and the step of forming the bonding agent layer by applying the bonding agent to the assembly can be carried either entirely continually, or in a partly continuous manner. The thus fabricated electromagnetic shielding bonding film may be attached to one side of a plastic base board such as acrylic plate or polyester plate, or may be laminated between a pair of such plastic base boards, and after being appropriately trimmed, the assembly may be used in a display device.

The thus obtained bonding film having an electromagnetic shielding and infrared blocking property can be directly attached to a display device such as CRT, PDP, LCD, and EL, by using the bonding agent included in the bonding film, or may be attached to a plate or a sheet such as an acrylic plate or a glass sheet for mounting the thus prepared assembly on a display device. The bonding film may also be used on the cases of measuring devices, measuring instruments and manufacturing devices, and inspection windows provided in such cases. The present invention may also be applied to windows of building and vehicles which may be exposed to electromagnetic interferences from radio towers and high tension electric cables. It is preferable to provide a grounding line in the geometrically patterned electroconductive material.

The electromagnetic shielding bonding film may be continuously laminated over the plastic base board by using a roller laminator and continually feeding the plastic base board.

The plastic base board preferably is colorless and transparent, but may also be tinted as long as it has a required transparency. Preferably, the thickness is in the range of 0.5 to 10 mm, and the transmission factor for all visible light range is 50% or more, or, more preferably, 80% or more. Typically materials for the plastic base board includes polycarbonate, polymethyl(metha)acrylate, polyethyleneterephthalate, polyether sulfone, polyetherketone, and acyronitrile-styrene copolymer.

An infrared absorption ratio of 50% or more in the wavelength range of 800 to 1,100 nm can be achieved in the bonding film by mixing organic infrared absorbing agents in the above mentioned bonding agent, or by applying a composition containing such organic infrared absorbing agents in a binder over the bonding agent layer surface or the reverse surface of the bonding film. Such organic infrared absorbing agents may include metal oxides such as iron oxide, cerium oxide, tin oxide and antimony oxide, indium-tin oxide (which is referred to as ITO hereinafter), tungsten hexachloride, tin chloride, copper (II) sulfide, chromium-cobalt complex salt, thiol-nickel complex compound, aminium compounds, and diimonium compounds (marketed by Nihon Kayaku KK). The compounds which are particularly effective in absorbing infrared radiation include such infrared absorbing agents as copper (II) sulfide, ITO, aminium compounds, di-imonium compounds, and metallic complex compounds. It is important to properly select the diameter of the primary particles. If the particle diameter is substantially larger than the wavelength of the infrared radiation, the blocking efficiency may be high, but the transparency drops because the irregular reflection by the surfaces of the particles cause a hazy appearance. If the particle diameter is excessively small, the shielding efficiency drops. The preferable range of the particle diameter is 0.01 to 5 $\mu$m, and an even more preferable range is 0.1 to 3 $\mu$m. The infrared absorbing agent is evenly dispersed in binder resins which may comprise epoxy resins such as bisphenol type A epoxy resin, bisphenol type F epoxy resin, and novolac type epoxy resin, diene resins such as polyisoprene, poly-1,2-butadiene, polyisobutane, and polybutane, polyacrylic acid ester copolymers such as ethylacrylate, butylacrylate, 2-ethylhexylacrylate, and t-butylacrylate, polyester resins such as polyvinylacetate, polyvinylpropionate, and polyolefin resins such as polyethylene, polypropylene, polystyrene, and EVA. The mixture ratio of the infrared absorbing agent should be preferably 0.1 to 10 weight parts, and more preferably 0.1 to 5 weight parts for 100 weight parts of the binder. If the mixture ratio is less than 0.01 weight parts, a required infrared absorbing ratio cannot be achieved. If the mixture ratio is greater than 10 weight parts, a required transparency cannot be achieved. These compounds are applied over the surface of the bonding agent layer of the bonding film or the reverse surface of the bonding film to a thickness in the range of 0.01 to 10 $\mu$m. The applied layer of the composition including infrared absorbing compounds may be cured by using heat or UV.

It is also possible to directly mix the infrared absorbing compounds with the bonding agent composition. In such a case, the added amount of the infrared absorbing agent should be in the range of 0.01 to 5 weight parts for 100 parts of the polymer which forms the bonding agent in view of shielding performance and transparency.

The part of the surface of the transparent plastic base member from which the electroconductive material has been removed presents an irregular surface because the surface was deliberately formed into an irregular surface in order to increase the adhesion force or because the marks of the reverse surface of the electroconductive material were imprinted on the surface of the transparent plastic base member. Therefore, the irregular reflection on the surface may damage the transparency of the base member, but by evenly applying a resin material layer, having a refraction index close to that of the base member, over such an irregular surface, the irregular reflection is minimized so that the transparency of the base member may be restored. The electroconductive material geometrically patterned on the surface of the transparent plastic base member has such a fine line width that it is practically invisible to naked eyes. The large line spacing also contributes to the invisibility of the electroconductive material. Also, it is believed that, because the pitch of the geometric pattern is sufficiently smaller than the wavelength of the electromagnetic radiation that is desired to be shielded, a superior shielding performance can be achieved.

EXAMPLE

Electromagnetic Shielding Bonding Film #A1

The plastic film consisted of transparent PET film having the thickness of 50 $\mu$m and the roll length of 300 m (marketed by Toyo Boseki KK under the tradename of A-4100, refraction index n=1,575). An electrolytic copper foil having the thickness of 18 $\mu$m was laminated thereover, by heating, under the condition of 180° C. and 30 kgf/cm², in continuous manner from the beginning to the end of the roll over the surface of the plastic film via an epoxy bonding film (marketed by Nikkan Kogyo KK under the tradename of Nikaflex, n=1.58, thickness 20 $\mu$m), serving as a bonding layer, with the coarse surface of the copper foil facing the epoxy bonding film.

The obtained roll of PET film laminated with copper foil is subjected to a photo-lithographic process (including the steps of resist film coating, photographic exposure, photographic development, chemical etching, and resist film removal), and a copper grid pattern having the line width of 25 μm and the line spacing of 500 μm was formed on the surface of the PET film by spraying ferrous chloride liquid etchant. After the resist was removed, the assembly was subjected to the steps of water washing, and drying, and a roll of Composition #A1 was obtained in a continuous manner from the beginning to the end of the roll. The obtained roll was free from creases or other visible defects. The transmission factor of Composition #A1 for visible light was 20% or less. A bonding agent composition containing an infrared absorbing agent which is described hereinafter was continuously applied over the surface of Composition #A1 to the dry thickness of approximately 40 μm, and after a drying process, Electromagnetic Shielding Bonding Film #A1 having an electromagnetic shielding property and a transparency was obtained as a roll which is continuous from the beginning to the end. Thereafter, Electromagnetic Shielding Bonding Film #A1 was applied over the surface of commercially available acrylic plate (marketed by KK Kurare under the tradename of Komoglass, thickness 3 mm), as the acrylic plate is fed out, by using a roll laminator with the surface of the bonding agent facing the acrylic plate under the temperature and pressure condition of 110° C. and 20 kgf/cm$^2$. The material for display devices is thus made in a continuous manner, and is cut into the required size. The cut material was then properly trimmed, and used for the fabrication of a display device.

EXAMPLE

Electromagnetic Shielding Bonding Film #A2

Aluminum foil having the thickness of 25 μm was bonded over the surface of PET film having the thickness of 25 μm and the roll length of 400 m via acrylic bonding film (marketed by DuPont under the tradename of Pyralux LF-0200, n=1.47, thickness 20 μm). This assembly consisting of PET film laminated with aluminum foil is subjected to a photo-lithographic process similar to that for Electromagnetic Shielding Bonding Film #A1, and an aluminum grid pattern having the line width of 25 μm and the line spacing of 250 μm was formed on the surface of the PET film by spraying a hydrochloric acid liquid etchant. After the resist film was removed, the assembly was subjected to the steps of water washing, and drying, and a roll of Composition #A2 was obtained in a continuous manner from the beginning to the end of the roll. The transmission factor of Composition #A2 for visible light was 20% or less. A bonding agent composition containing an infrared absorbing agent which is described hereinafter, was continuously applied over the surface of Composition #A2 to the dry thickness of approximately 30 μm, and after a drying process, Electromagnetic Shielding Bonding Film #A2 having an electromagnetic shielding property and a transparency was obtained as a roll which is continuous from the beginning to the end. The obtained roll was free from creases or other visible defects. Thereafter, Electromagnetic Shielding Bonding Film #A2 was applied over the surface of commercially available acrylic plate (marketed by KK Kurare under the tradename of Komoglass, thickness 3 mm) by using a thermal press with the surface of the bonding agent facing the acrylic plate under the temperature and pressure condition of 110° C., 30 kgf/cm$^2$, and 30 minutes. The material was then properly trimmed, and used for the fabrication of a display device.

EXAMPLE

Electromagnetic Shielding Bonding Film #A3

Electroless nickel plating to the thickness of 2 μm was applied over the surface of PET film having the thickness of 50 μm and the roll length of 300 m via an additive bonding agent layer (n=1.57) having the thickness of 20 μm. This assembly is subjected to a photo-lithographic process similar to that for Electromagnetic Shielding Bonding Film #A1, and a nickel grid pattern having the line width of 12 μm, the line spacing of 500 μm, and the thickness of 2 μm was formed on the surface of the PET film by spraying ferrous chloride liquid etchant. After the resist film was removed, the assembly was subjected to the steps of water washing, and drying, and a roll of Composition #A3 was obtained in a continuous manner from the beginning to the end of the roll. The transmission factor of Composition #A3 for visible light was 20% or less. A bonding agent which is described hereinafter was continuously applied over the surface of Composition #A3 carrying the geometric pattern to the dry thickness of approximately 70 μm, and after a drying process, an Infrared Blocking layer (1) which is described hereinafter was applied over the reverse surface of the PET film to the thickness of 3 μm in a continuous manner. After the final drying process, Electromagnetic Shielding Bonding Film #A3 having an electromagnetic shielding property and a transparency was obtained as a roll which is continuous from the beginning to the end. The obtained roll was free from creases or other visible defects.

Thereafter, Electromagnetic Shielding Bonding Film #A3 was applied over the surface of commercially available acrylic plate (marketed by KK Kurare under the tradename of Komoglass, thickness 3 mm) by using a roller laminator with the surface of the bonding agent facing the acrylic plate under the temperature and pressure condition of 110° C. and 20 kgf/cm$^2$. The material for display devices is thus made in a continuous manner, and is cut into the required size. The cut material was then properly trimmed, and used for the fabrication of a display device.

| <Bonding Agent Composition #A1> | |
|---|---|
| TBA-HME (Hitachi Kasei Kogyo KK; high polymer epoxy resin, Mw = 300,000) | 100 weight parts |
| YD-8125 Toto Kasei Kogyo KK; bisphenol type A epoxy resin) | 25 weight parts |
| IPDI (Hitachi Kasei Kogyo KK; mask isophorone-di-isioyanate) | 12.5 weight parts |
| 2-ethyl-4-methylimidazole | 0.3 weight parts |
| SIR-159 (Mitsui Toatsu Kagaku KK, infrared absorbing agent) | 1.4 weight parts |
| MEK (methyl-ethyl-ketone) | 330 weight parts |
| cyclohexanone | 15 weight parts |

The refraction index of Bonding Agent Composition #A1 after drying the solvent was 1.57.

| <Bonding Agent Composition #A2> | |
|---|---|
| YP-30 (Toto Kasei KK, phenoxy resin, Mw = 60,000) | 100 weight parts |
| YD-8125 (Toto Kasei Kogyo KI; bisphenol type A epoxy resin) | 10 weight parts |
| IPDI (Hitachi Kasei Kogyo KK; mask-isophorone-di-isocyanate) | 5 weight parts |

-continued

| <Bonding Agent Composition #A2> | |
|---|---|
| 2-ethyl-4-methylimidazole | 0.3 weight parts |
| IRG-022 (Nihon Kayaku KK, di-imonium compound, infrared absorbing agent) | 1.2 weight parts |
| MEK | 285 weight parts |
| cyclohexanone | 5 weight parts |

The refraction index of Bonding Agent Composition #A2 after drying the solvent was 1.55.

| <Bonding Agent Composition #A3> | |
|---|---|
| HTR-600LB (Teikoku Kagaku Sangyo KK, polyacrylic acid ester, Mw = 700,000) | 100 weight parts |
| Colonate L (Nihon Polyurethane Kogyo KK, 3-functional isocyanate) | 4.5 weight parts |
| dibutyl-tin laurate | 0.4 weight parts |
| toluen | 450 weight parts |
| ethylacetate | 10 weight parts |

The refraction index of Bonding Agent Composition #A3 was 1.47.

| <Infrared Blocking Layer Composition #A1> | |
|---|---|
| HTR-280 (Teikoku Kagaku Sangyo KK, polyacrylic acid ester copolymer, Mw = 700,000) | 100 weight parts |
| (UFP-HX (Sumitomo Kinzoku Kozan KK, ITO, average particle diameter 0.1 µm) | 0.5 weight parts |
| Colonate L (Nihon Polyurethane Kogyo KK, 3-functional isocyanate) | 5 weight parts |
| dibutyl-tin laurate | 0.4 weight parts |
| toluen | 450 weight parts |
| ethylacetate | 10 weight parts |

The composition was applied by using a roll coater, and was cured at 90° C. for 20 minutes, and the cured layer had a refraction index of 1.49.

Infrared Blocking Layer Composition #A2

Infrared Blocking Layer Composition #A2 was used in a similar manner except for that one weight part of copper (II) sulfide (Wako Junyaku KK; crushed to the average particle diameter of 0.5 µm by using a Henschel mixer) instead of UFP-HX of Infrared Blocking Layer Composition #A2. The obtained composition has a refraction index of 1.50.

Example #A1

Example #A1 consists of a display device which was formed according to the method of making Electromagnetic Shielding Bonding Film #A1 by using Bonding Agent Composition #A1.

Example #A2

Example #A2 consists of a display device which was formed according to the method of making Electromagnetic Shielding Bonding Film #A2 by using Bonding Agent Composition #A2.

Example #A3

Example #A3 consists of a display device which was formed according to the method of making Electromagnetic Shielding Bonding Film #A1 by using Bonding agent Composition #A3 and Infrared Blocking Layer Composition #A1.

Example #A4

A display device which was prepared identically as the display device of Example #A1 except for that the line width was 35 µm instead of 25 µm.

Example #A5

A display device which was prepared identically as the display device of Example #A2 except for that the line width was 12 µm instead of 25 µm.

Example #A6

A display device which was prepared identically as the display device of Example #A3 except for that the line spacing was 800 µm instead of 500 µm, and Infrared Blocking Layer Composition #A2 was used instead of Infrared Blocking Layer Composition #A1.

Example #A7

A display device which was prepared identically as the display device of Example #A1 except for that the line spacing was 250 µm instead of 500 µm.

Example #A8

A display device which was prepared identically as the display device of Example #A2 except for that the line thickness was 35 µm instead of 25 µm.

Example #A9

A display device which was prepared identically as the display device of Example #A1 except for that the electro-conductive metallic material consisted of darkened copper.

Example #A10

A display device which was prepared identically as the display device of Example #A1 except for that the geometric pattern consisted of a repetition of a right triangle instead of the grid pattern of Example #A1.

Example #A11

A display device which was prepared identically as the display device of Example #A1 except for that the geometric pattern consisted of a repetition of a right hexagon instead of the grid pattern of Example #A1.

Example #A12

A display device which was prepared identically as the display device of Example #A1 except for that the geometric pattern consisted of a repetition of a right octagon and a square instead of the grid pattern of Example #A1.

Comparative Example #A1

Bonding Agent Composition #A1 was directly applied over the surface of PET film over which ITO film was deposited to the thickness of 2,000 Å by vapor deposition, instead of the patterned copper foil. The assembly was used for preparing a display device in the same way as Example #A1.

Comparative Example #A2

Similarly as Comparative Example #A1, Bonding Agent Composition #A2 was directly applied over the surface of PET film over which ITO film was deposited to the thickness of 2,000 Å by vapor deposition, instead of the patterned copper foil. The assembly was used for preparing a display device in the same way as Comparative Example #A1.

Comparative Example #A3

Comparative Example #A3 consisted of a display device which was prepared identically as the display device of Example #A1 except for that the line width was 50 μm instead of 25 μm.

Comparative Example #A4

Comparative Example #A4 consisted of a display device which was prepared identically as the display device of Example #A2 except for that the line spacing was 150 μm instead of 250 μm.

Comparative Example #A5

Comparative Example #A5 consisted of a display device which was prepared identically as the display device of Example #A2 except for that the line thickness was 70 μm instead of 25 μm.

The infrared blocking ratio, electromagnetic shielding performance, visible light transmission factor, invisibility, bonding property before and after curing, fading property, and roll appearance of the electromagnetic shielding bonding films and the display devices were actually measured, and the measured results are summarized in Tables 1 and 2.

The infrared blocking ratio was measured as an average value of the infrared absorption ratio for the wavelength range of 900 to 1,000 nm by using a spectrophotometer (marketed by KK Hitachi Seisakusho under the tradename of U-3410).

The electromagnetic shielding performance was measured by placing the specimen between two flanges of a coaxial waveguide converter (market by Nihon Koshuha KK under the tradename of TWC-S-024), and using a spectro-analyzer (marketed by YHP under the tradename of 8510B Vector Network Analyzer) at the frequency of 1 GHz.

The visible light transmission factor was measured as an average value of the transmission factor over the wavelength range of 400 to 800 nm by using a double beam spectrophotoanalyzer (marketed by KK Hitachi under the tradename of Type 200-10).

The invisibility was measured by placing the display device at the distance of 0.5 m, and evaluating if the geometric pattern of the electroconductive metallic material is visible or not. The specimens were graded into "very good", and "good" depending on the degree of invisibility, and "NG" when the pattern was visible.

The bonding property was measured by using a tensile strength testing machine (marketed by Toyo Baldwin KK under the tradename of Tensilon UTM-4-100) with the width of 10 mm, 90 degree direction and peeling speed of 50 mm/minute.

The refraction index was measured by using a refraction meter (marketed by KK Atago Kogaku Kikai Seisakusho under the tradename of Abbe refraction meter) at the temperature of 25° C.

TABLE 1

| items | #A1 | #A2 | #A3 | #A4 | #A5 | #A6 | #A7 | #A8 | #A9 | #A10 | #A11 | #A12 |
|---|---|---|---|---|---|---|---|---|---|---|---|---|
| method of forming conductive layer | foil bonding | foil bonding | plating | foil bonding | foil bonding | plating | foil | foil | foil | foil | foil | foil |
| conductive material | Cu | Al | Ni | Cu | Al | Ni | Cu | Al | darkened Cu | Cu | Cu | Cu |
| plastic film | PET | PET | PET | PET | PET | PET | PET | PET | PET | PET | PET | PET |
| shape | square | square | square | square | square | square | square | square | square | right triangle | right hexagon | octagon + square |
| patterning method *1 | CE | CE | M | CE | CE | M | CE | CE | CE | CE | CE | CE |
| line width (μm) | 25 | 25 | 12 | 35 | 12 | 12 | 25 | 25 | 25 | 25 | 25 | 25 |
| line spacing (μm) | 500 | 250 | 500 | 500 | 250 | 800 | 250 | 250 | 500 | 500 | 500 | 500 |
| line thickness (μm) | 18 | 25 | 2 | 18 | 25 | 2 | 18 | 35 | 18 | 18 | 18 | 18 |
| bonding agent composition *2 | #A1 | #A2 | #A3 | #A1 | #A2 | #A3 | #A1 | #A2 | #A1 | #A1 | #A1 | #A1 |
| EMI shielding performance | 50 | 40 | 48 | 56 | 38 | 30 | 55 | 56 | 48 | 54 | 50 | 48 |
| visible light transmission factor (%) | 74 | 69 | 70 | 68 | 75 | 77 | 70 | 69 | 70 | 69 | 75 | 77 |
| invisibility | good | good | good | good | good | good | good | good | very good | good | good | good |
| infrared blocking ratio (%) | 80 | 78 | 80 | 65 | 65 | 65 | 80 | 80 | 80 | 80 | 80 | 80 |
| initial bonding force (kgf/cm$^2$) | 1.2 | 1.7 | 0.9 | 1.2 | 1.7 | 1.7 | 1.2 | 1.7 | 1.2 | 1.2 | 1.1 | 1.1 |
| bonding force after 80° C.-1,000 hrs of aging | 1.2 | 1.5 | 0.8 | 1.2 | 1.6 | 1.5 | 1.2 | 1.5 | 1.2 | 1.2 | 1.1 | 1.1 |
| fading after 80° C.-1,000 hrs of aging | none | none | none | none | none | none | none | none | none | none | none | none |
| web appearance | good | good | good | good | good | good | good | good | good | good | good | good |

*1 CE: chemical deposition, M: plating
*2 #A1: Bonding Agent Composition #A1, #A2: Bonding Agent Composition #A2, and #A3: Bonding Agent Composition #A3.

TABLE 2

| items | #A1 | #A2 | #A3 | #A4 | #A5 |
|---|---|---|---|---|---|
| | comparative examples | | | | |
| method of forming conductive layer | vapor deposition | vapor deposition | foil | foil | foil |
| conductive material | ITO | Al | Cu | Al | Al |
| plastic film | PET | PET | PET | PET | PET |
| shape | entire surface | entire surface | square | square | square |
| patterning method*1 | — | — | CE | CE | CE |
| line width ($\mu$m) | — | — | 50 | 25 | 25 |
| time spacing ($\mu$m) | — | — | 500 | 150 | 250 |
| time thickness ($\mu$m) | 0.2 | 0.2 | 18 | 25 | 70 |
| bonding agent composition*2 | #A1 | #A2 | #A1 | #A2 | #A2 |
| EMI shielding performation | 18 | 35 | 39 | 37 | 45 |
| visible light transmission factor (%) | 85 | 20> | 55 | 40 | 60 |
| invisibility | good | NG | NG | NG | NG |
| infrared blocking ratio (%) | 10> | 10> | 10> | 10> | 10> |
| initial bonding force (kgf/cm$^2$) | 1.2 | 1.7 | 1.2 | 1.7 | 0.9 |
| bonding force after 80° C.- 1,000 hrs of aging | 1.2 | 1.5 | 1.2 | 1.5 | 0.8 |
| fading after 80° C.- 1,000 hrs of aging | none | none | none | none | none |
| web appearance | good | good | good | good | good |

*1-CE: chemical deposition, M: plating
*2-#A1: Bonding Agent Composition #A1,#A2: Bonding Agent Composition #A2, and #A3: Bonding Agent Composition #A3

Comparative Examples #A1 and #A2 involve vapor deposition of ITO and A1, respectively, but ITO lacks the desired electromagnetic shielding property, and A1 lacks the desired visible light transmission factor. Comparative Example #A3 has a low visible light transmission factor with the broad line width of 50 $\mu$m, and a poor invisibility whereas the present invention features an aperture ratio of 80% or better, and a line width of 40 $\mu$m or less. Comparative Example #A4 has a low visible light transmission factor with the narrow line spacing of 150 $\mu$m similarly as Comparative Example #A3, and a poor invisibility whereas the present invention features an aperture ratio of 80% or better, and a line spacing of 200 $\mu$m or wider. Comparative Example #A5 has a poor invisibility with the line thickness of 70 $\mu$m whereas the present invention features an aperture ratio of 80% or better, and a line thickness of 40 $\mu$m or less. On the other hand, Examples #A1 to #A12 according to the present invention all demonstrate favorable electromagnetic shielding properties of 30 dB or better. The present invention also provides a visible light transmission factor of 68% or better, and a favorable invisibility. The initial bonding force and the bonding force after 1,000 hours of an aging test at 80° C. are sufficiently high, and the web appearance is also favorable.

As can be appreciated from the description of the above examples, the electromagnetic shielding bonding film of the present application can provide a favorable infrared blocking property, and its capability to closely attach to the object allows a high electromagnetic shielding performance without involving substantially any electromagnetic leakage. The present invention further provides favorable optical properties such as a high visible light transmission factor, and a favorable invisibility. The bonding film according to the present invention can maintain a superior bonding force even at high temperatures over an extended time period, and can be made available as web (or as a roll) without involving any visible defects such as creases. By using polyethyleneterephthalate film for the plastic film, a highly transparent, heat-resistance, economical and easy handling electromagnetic shielding bonding film can be obtained. By using a layer of copper, aluminum or nickel having a thickness of 3 to 40 $\mu$m for the electroconductive metallic material layer, and making the surface of the layer facing the transparent plastic film into a coarse surface, a highly workable and economical electromagnetic shielding bonding film can be obtained. By using copper having at least its outer surface darkened, a fade-resistant and high-contrast electromagnetic shielding bonding film can be obtained. By using paramagnetic metal for the electroconductive metallic material, an electromagnetic shielding bonding film having a high electromagnetic shielding property can be obtained. When this electromagnetic shielding bonding film is applied to a display device, a display device having a favorable electromagnetic shielding property, a high visible light transmission factor, and a favorable invisibility, and capable of displaying clear images can be obtained.

EXAMPLE

Bonding Film #B1

The plastic film consisted of transparent PET film having the thickness of 50 $\mu$m (refraction index n=1,575). An electrolytic copper foil having the thickness of 18 $\mu$m was laminated thereover, by heating, under the condition of 180° C. and 30 kgf/cm$^2$, via an epoxy bonding sheet (marketed by Nikkan Kogyo KK under the tradename of Nikaflex, n=1.58), serving as a bonding layer, with the coarse surface of the copper foil facing the epoxy bonding sheet.

The obtained PET film laminated with copper foil is subjected to a photo-lithographic process (including the steps of resist film coating, photographic exposure, photographic development, chemical etching, and resist film removal), and a copper grid pattern having the line width of 25 $\mu$m and the line spacing of 500 $\mu$m was formed on the surface of the PET film to obtain Composition #B1. The visible light transmission factor of Composition #B1 was 20% or less. A bonding agent which is described hereinafter was applied over the surface of Composition #B1 carrying the geometric pattern to the dry thickness of approximately 40 μm, and after a drying process, Bonding Film #B1 having an electromagnetic shielding property and an optical transparency was obtained. An infrared blocking layer which is described hereinafter was applied to the surface of Bonding Film #B1 opposite to the surface carrying the bonding agent layer, to the dry thickness of approximately 5 μm. Thereafter, Bonding Film #B1 was applied over the surface of commercially available acrylic plate (marketed by KK kurare under the tradename of Komoglass, thickness 3 mm) by using a roll laminator under the temperature and pressure condition of 110° C. and 20 kgf/cm².

EXAMPLE

Bonding Film #B2

Aluminum foil having the thickness of 25 μm was bonded over the surface of PET film having the thickness of 25 μm serving as the transparent base material via acrylic bonding film (marketed by DuPont under the tradename of Pyralux LF-0200, n=1.47). This assembly consisting of PET film laminated with aluminum foil is subjected to a photolithographic process similar to that for Bonding Film #1, and an aluminum grid pattern having the line width of 25 μm and the line spacing of 250 μm was formed on the surface of the PET film to obtain. The visible light transmission factor of this assembly was 20% or less. A bonding agent which is described hereinafter was applied over the surface of this assembly carrying the geometric pattern to the dry thickness of approximately 30 μm, and after a drying process, bonding Film #B2 having an electromagnetic shielding property and an optical transparency was obtained. An infrared blocking layer which is described hereinafter was applied to the surface of Bonding Film #B2 opposite to the surface carrying the bonding agent layer, to the dry thickness of approximately 1 μm. Thereafter, Bonding Film #B2 was applied over the surface of commercially available acrylic plate by using a thermal press under the temperature and pressure condition of 110° C., 30 kgf/cm² and 30 minutes.

EXAMPLE

Bonding Film #B3

Electroless nickel plating was applied over the surface of PET film having the thickness of 50 μm by using a mask so as to form a nickel grid pattern having the line width of 12 μm, the line spacing of 500 μm, and the thickness of 2 μm. The visible light transmission factor of this assembly was 20% or less. A bonding agent which is described hereinafter was applied over the surface of this assembly carrying the geometric pattern to the dry thickness of approximately 70 μm. An infrared blocking layer which is described hereinafter was applied to the surface of Bonding Film #B3 opposite to the surface carrying the bonding agent layer, to the dry thickness of approximately 3 μm. Thereafter, Bonding Film #B3 was applied over the surface of commercially available acrylic plate by using a roll laminator under the temperature and pressure condition of 110° C., 20 kgf/cm².

<Bonding Agent Composition #B1>

| | |
|---|---|
| TBA-HME (Hitachi Kasei Kogyo KK; high polymer epoxy resin, Mw = 300,000) | 100 weight parts |
| YD-8125 (Toto Kasei Kogyo KK; bisphenol type A epoxy (resin) | 25 weight parts |

-continued

<Bonding Agent Composition #B1>

| | |
|---|---|
| IPDI (Hitachi Kasei Kogyo KK; mask isophorone-di-isocyanate) | 12.5 weight parts |
| 2-ethyl-4-methylimidazole | 0.3 weight parts |
| MEK (methyl-ethyl-ketone) | 330 weight parts |
| cyclohexanone | 15 weight parts |

The refraction index of this composition after drying the solvents was 1.57.

<Bonding Agent Composition #B2>

| | |
|---|---|
| YP-30 (Toto Kasei KK, phenoxy resin, Mw = 60,000) | 100 weight parts |
| YD-8125 (Toto Kasei Kogyo KK; bisphenol type A epoxy resin) | 10 weight parts |
| IPDI (Hitachi Kasei Kogyo KK; mask-isocyanate) | 5 weight parts |
| 2-ethyl-4-methylimidazole | 0.3 weight parts |
| MEK | 285 weight parts |
| cyclohexanone | 5 weight parts |

The refraction index of this composition after drying the solvents was 1.55.

<Bonding Agent Composition #B3>

| | |
|---|---|
| HTR-600LB (Teikoku Kagaku Sangyo KK, polyacrylic acid ester, Mw = 700,000) | 100 weight parts |
| Colonate L (Nihon Polyurethane Kogyo KK, 3-functional isocyanate) | 4.5 weight parts |
| dibutyl-tin laurate | 0.4 weight parts |
| toluen | 450 weight parts |
| ethylacetate | 10 weight parts |

The refraction index of this composition after drying the solvents was 1.47.

<Infrared Blocking Layer Composition #B1>

| | |
|---|---|
| YD-8125 (Toto Kasei Kogyo KK; bisphenol type A epoxy resin) | 100 weight parts |
| copper (II) sulfide (Wako Junyaku KK, crushed to an average particle diameter of 0.5 μm by using a Henschel mixer) | 4 weight parts |
| 2-ethyl-3-methylimidazol | 0.5 weight parts |
| dicyandiamide | 5 weight parts |
| MEK | 200 weight parts |
| etyleneglycol-monomethyether | 20 weight parts |

The compound was applied with an applicator at room temperature, and was cured by heating at 90° C. for 30 minutes.

<Infrared Blocking Layer Composition #B2>

| | |
|---|---|
| HTR-280 (Teikoku Kagaku Sangyo KK, polyacrylic acid ester copolymer, Mw = 700,000) | 100 weight parts |
| UFP-HX (Sumitomo Kinzoku Kozan KK, ITO, average particle diameter 0.1 μm) | 0.5 weight parts |
| Colonate L | 5 weight parts |

-continued

| <Infrared Blocking Layer Composition #B2> | |
|---|---|
| dibutyl-tin laurate | 0.4 weight parts |
| toluen | 450 weight parts |
| ethylacetate | 10 weight parts |

The compound was applied with an applicator at room temperature, and was cured by heating at 90° C. for 20 minutes.

| <Infrared Blocking Layer Composition #B3> | |
|---|---|
| copper (II) sulfide (Wako Junyaku KK; crushed to the average particle diameter of 0.5 μm by using a Henschel mixer) | 1 weight part |

EXAMPLE #B1

Example #B1 consists of shield plate which was prepared according to the procedure for preparing Bonding Film Composition #B1 by using Bonding Agent Composition #B1 and Infrared Blocking Layer Composition #B1.

EXAMPLE #B2

Example #B2 consists of shield plate which was prepared according to the procedure for preparing Bonding Film Composition #B2 by using Bonding Agent Composition #B2 and Infrared Blocking Layer Composition #B1.

EXAMPLE #B3

Example #B3 consists of shield plate which was prepared according to the procedure for preparing Bonding Film Composition #B3 by using Bonding Agent Composition #B3 and Infrared Blocking Layer Composition #B1.

EXAMPLE #B4

Example #B4 consists of shielding plate which was identically prepared as Example #B1 except for that the line width was 35 μm instead of 25 μm and Infrared Blocking Layer Composition #B2 was used instead of #B1.

EXAMPLE #B5

Example #B5 consists of shielding plate which was identically prepared as Example #B2 except for that the line width was 12 μm instead of 25 μm and Infrared Blocking Layer Composition #B2 was used instead of #B1.

EXAMPLE #B6

Example #B6 consists of shielding plate which was identically prepared as Example #B3 except for that the line spacing was 800 μm instead of 500 μm and Infrared Blocking Layer Composition #B2 was used instead of #B1.

EXAMPLE #B7

Example #B7 consists of shielding plate which was identically prepared as Example #B1 except for that the line spacing was 250 μm instead of 500 μm.

EXAMPLE #B8

Example #B8 consists of shielding plate which was identically prepared as Example #B2 except for that the line spacing was 35 μm instead of 25 μm.

EXAMPLE #B9

Example #B6 consists of shielding plate which was identically prepared as Example #B1 except for that the electroconductive material consisted of darkened copper and Infrared Blocking Layer Composition #B2 was used instead of #B1.

EXAMPLE #B10

Example #B10 consists of shielding plate which was identically prepared as Example #B1 except for that the geometric pattern consisted of a repetition of a right triangle instead of the grid pattern of Example #B1 and Infrared Blocking Layer Composition #B2 was used instead of #B1.

EXAMPLE #B11

Example #B11 consists of shielding plate which was identically prepared as Example #B1 except for that the geometric pattern consisted of a repetition of a right hexagon instead of the grid pattern of Example #B1 and one weight part of Infrared Blocking Layer Composition #B3 was dispersed in 100 weight parts of the bonding agent.

EXAMPLE #B12

Example #B12 consists of shielding plate which was identically prepared as Example #B1 except for that the geometric pattern consisted of a repetition of a right octagon and a square instead of the grid pattern of Example #B1 and one weight part of Infrared Blocking Layer Composition #B3 was dispersed in 100 weight parts of the bonding agent.

COMPARATIVE EXAMPLE #B1

PET film over which ITO film was vapor deposited to the thickness of 2,000 Å by vapor deposition, instead of the patterned copper foil, was used. Bonding Agent Composition #B1 was directly applied over the assembly without geometrically patterning the ITO film. Thereafter, shielding plate was prepared therefrom in the same way as Example #B1 without forming an infrared blocking layer to obtain Comparative Example #B1.

COMPARATIVE EXAMPLE #B2

Transparent PET film serving as the transparent plastic base member, over which aluminum film was vapor deposited, was used. Bonding Agent Composition #B2 was directly applied over the surface of the assembly without geometrically patterning the aluminum film. Thereafter, shielding plate was prepared therefrom in the same way as Example #B1 to obtain Comparative Example #B2.

COMPARATIVE EXAMPLE #B3

Comparative Example #B3 consisted of shielding plate which was prepared identically as the shielding plate of Example #B1 except for that the line width was 50 μm instead of 25 μm, and no infrared blocking layer was formed.

COMPARATIVE EXAMPLE #B4

Comparative Example #B4 consisted of shielding plate which was prepared identically as the shielding plate of Example #B2 except for that the line spacing was 150 μm instead of 250 μm, and no infrared blocking layer was formed.

COMPARATIVE EXAMPLE #B5

Comparative Example #B5 consisted of shielding plate which was prepared identically as the shielding plate of Example #B2 except for that the line thickness was 70 μm instead of 25 μm, and no infrared blocking layer was formed.

COMPARATIVE EXAMPLE #B6

Comparative Example #B6 consisted of shielding plate which was prepared identically as the shielding plate of Example #B1 except for that phenol-formaldehyde (Mw=50,000, n=1.73) was used as the bonding agent, and no infrared blocking layer was formed.

COMPARATIVE EXAMPLE #B7

Comparative Example #B7 consisted of shielding plate which was prepared identically as the shielding plate of Example #B3 except for that polydimethylsiloxane (Mw=45,000, n=1.43) was used as the bonding agent, and no infrared blocking layer was formed.

COMPARATIVE EXAMPLE #B8

Comparative Example #B8 consisted of shielding plate which was prepared identically as the shielding plate of Example #B3 except for that polyvinylidenefluoride (Mw=120,000, n=1.42) was used as the bonding agent, and no infrared blocking layer was formed.

COMPARATIVE EXAMPLE #B9

Comparative Example #B9 consisted of shielding plate which was prepared identically as the shielding plate of Example #B1 except for that polyethylene film containing a filler and having a thickness of 60 μm (with a visible light transmission factor of 20% or less) was used as the transparent plastic base member, and no infrared blocking layer was formed.

COMPARATIVE EXAMPLE #B10

Comparative Example #B10 consisted of shielding plate which was prepared identically as the shielding plate of Example #1 except for that the thickness of Infrared Blocking Layer Composition #B2 was 0.05 μm instead of 5 μm.

The infrared blocking ratio, EMI shielding performance, visible light transmission factor, invisibility, bonding property before and after heating, and fading property were actually measured, and the measured results are summarized in Tables 3 and 4.

The infrared blocking ration was measured as an average value of the infrared absorption ratio for the wavelength range of 900 to 1,000 nm by using a spectrophotometer (marketed by KK Hitachi Seisakusho under the tradename of U-3410).

The EMI shielding performance was measured by placing the specimen between two flanges of a coaxial waveguide converter (marketed by Nihon Koshuha KK under the tradename of TWC-S-024), and using a spectro-analyzer (marketed by YHP under the tradename of 8510B Vector Network Analyzer) at the frequency of 1 GHz.

The visible light transmission factor was measured as an average value of the transmission factor over the wavelength range of 400 to 800 nm by using a double beam spectrophotoanalyzer (marketed by KK Hitachi under the tradename of Type 200-10).

The invisibility was measured by placing the display device at the distance of 0.5 m, and evaluating if the geometric pattern of the electroconductive metallic material is visible or not. The specimens were graded into "very good", and "good" depending on the degree of invisibility, and "NG" when the pattern was visible.

The bonding property was measured by using a tensile strength testing machine (marketed by Toyo Baldwin KK under the tradename of Tensilon UTM-4-100) with the width of 10 mm, 90 degree direction and peeling speed of 50 mm/minute.

The refraction index was measured by using a refraction meter (marketed by KK Atago Kogaku Kikai Seisakusho under the tradename of Abbe refraction meter) at the temperature of 25° C.

TABLE 3

| Examples | method for forming conductive layer | transparent plastic base member | electro-conductive material | geometric pattern 15-1a | | | | | bonding agent |
|---|---|---|---|---|---|---|---|---|---|
| | | | | pattern | forming method | line width (μm) | line spacing (μm) | line thickness (μm) | |
| #B1 | foil bonding | PET (50 μm) | Cu | square | chemical etching | 25 | 500 | 18 | Bonding Agent #B1 (high polymer epoxy, n = 1.57) |
| #B2 | foil bonding | PET (25 μm) | Al | square | chemical etching | 25 | 250 | 25 | Bonding Agent #B2 (phenoxy resin, n = 1.55) |
| #B3 | drawing | PET (50 μm) | Ni | square | plating | 12 | 500 | 2 | Bonding Agent #B3 (acrylic resin, n = 1.47) |
| #B4 | foil bonding | PET (50 μm) | Cu | square | chemical etching | 35 | 500 | 18 | Bonding Agent #B1 |
| #B5 | foil bonding | PET (25 μm) | Al | square | chemical etching | 12 | 250 | 25 | Bonding Agent #B2 |
| #B6 | drawing | PET (50 μm) | Ni | square | plating | 12 | 800 | 2 | Bonding Agent #B3 |
| #B7 | foil bonding | PET (50 μm) | Cu | square | chemical etching | 25 | 250 | 18 | Bonding Agent #B1 |
| #B8 | foil bonding | PET (25 μm) | Al | square | chemical etching | 25 | 250 | 35 | Bonding Agent #B2 |
| #B9 | foil bonding | PET (50 μm) | darkened Cu | Square | chemical etching | 25 | 500 | 18 | Bonding Agent #B1 |
| #B10 | foil bonding | PET (50 μm) | Cu | right triangle | chemical etching | 25 | 500 | 18 | Bonding Agent #B1 |
| #B11 | foil bonding | PET (50 μm) | Cu | right hexagon | chemical | 25 | 500 | 18 | Bonding Agent #B1 |

TABLE 3-continued

| | | | | | etching | | | | |
|---|---|---|---|---|---|---|---|---|---|
| #B12 | foil bonding | PET (50 μm) | Cu | right octagon + square | chemical etching | 25 | 500 | 18 | Bonding Agent #B1 |

15-1b

| | | optical properties | | | | Bonding properties | | |
|---|---|---|---|---|---|---|---|---|
| Examples | infrared blocking layer | Infrared blocking ratio (%) | EMI shielding performance (dB) | Visible light transmission factor (%) | Invisibility | initial bonding force (kg/cm$^2$) | bonding force after 80° C., 1,000 hrs of aging (kg/cm$^2$) | fading after 80° C., 1,000 hrs of aging |
| #B1 | Composition #B1 | 80 | 50 | 74 | good | 1.2 | 1.2 | none |
| #B2 | Composition #B1 | 78 | 40 | 69 | good | 1.7 | 1.5 | good |
| #B3 | Composition #B1 | 80 | 48 | 70 | good | 0.9 | 0.8 | none |
| #B4 | Composition #B2 | 65 | 56 | 68 | good | 1.2 | 1.2 | none |
| #B5 | Composition #B2 | 65 | 38 | 75 | good | 1.7 | 1.6 | none |
| #B6 | Composition #B2 | 65 | 30 | 77 | good | 1.7 | 1.5 | none |
| #B7 | Composition #B1 | 80 | 55 | 70 | good | 1.2 | 1.2 | none |
| #B8 | Composition #B1 | 80 | 56 | 69 | good | 1.7 | 1.5 | none |
| #B9 | Composition #B2 | 65 | 48 | 70 | very good | 1.2 | 1.2 | none |
| #B10 | Composition #B2 | 65 | 54 | 69 | good | 1.2 | 1.2 | none |
| #B11 | Composition #B3 was directly added to bonding layer | 62 | 50 | 75 | good | 1.1 | 1.1 | none |
| #B12 | Composition #B3 was directly added to bonding layer | 62 | 48 | 77 | good | 1.1 | 1.1 | none |

TABLE 4

15-2a

| | method for forming conductive layer | transparent plastic base member | electro-conductive material | Geometric pattern | | | | | |
|---|---|---|---|---|---|---|---|---|---|
| Comparative Examples | | | | pattern | forming method | Line width (μm) | Line spacing (μm) | line thickness (μm) | bonding agent |
| #B1 | vapor deposition | PET (50 μm) | ITO | — | uniform vapor deposition | — | — | 0.2 | Bonding Agent #B1 |
| #B2 | vapor deposition | PET (25 μm) | Al | — | uniform vapor deposition | — | — | 0.2 | Bonding Agent #B2 |
| #B3 | foil bonding | PET (50 μm) | Cu | square | chemical etching | 50 | 500 | 18 | Bonding Agent #B1 |
| #B4 | foil bonding | PET (25 μm) | Al | square | chemical etching | 25 | 150 | 25 | Bonding Agent #B2 |
| #B5 | foil bonding | PET (25 μm) | Al | square | plating | 25 | 250 | 70 | Bonding Agent #B2 |
| #B6 | foil bonding | PET (50 μm) | Cu | square | chemical etching | 25 | 500 | 18 | phenol-formaldehyde (n = 1.73) |
| #B7 | drawing | PET (50 μm) | Ni | square | plating | 12 | 500 | 2 | polydimethylsiloxane (n = 1.43) |
| #B8 | drawing | PET (50 μm) | Ni | square | plating | 12 | 500 | 2 | polyvinylidiene fluoride (n = 1.42) |
| #B9 | foil bonding | polyethylene with filler (60 μm) | Cu | square | chemical etching | 25 | 500 | 18 | Bonding Agent #B1 |
| #B10 | foil bonding | PET (50 μm) | Cu | square | chemical etching | 25 | 500 | 18 | Bonding Agent #B2 |

15-2b

| | | optical properties | | | | bonding properties | | |
|---|---|---|---|---|---|---|---|---|
| Comparative Examples | infrared blocking layer | Infrared blocking ratio (%) | EMI shielding performance (dB) | Visible light transmission factor (%) | invisibility | initial bonding force (kg/cm$^2$) | bonding force after 80° C., 1,000 hrs of aging (kg/cm$^2$) | fading after 80° C., 1,000 hrs of aging |
| #B1 | — | <10 | 18 | 85 | good | 1.2 | 1.2 | none |
| #B2 | — | <10 | 35 | <20 | NG | 1.7 | 1.5 | none |
| #B3 | — | <10 | 39 | 55 | NG | 1.2 | 1.2 | none |
| #B4 | — | <10 | 37 | 40 | NG | 1.7 | 1.5 | none |

TABLE 4-continued

| | | | | | | | | |
|---|---|---|---|---|---|---|---|---|
| #B5 | — | <10 | 45 | 60 | NG | 0.9 | 0.8 | none |
| #B6 | — | <10 | 50 | <20 | — | <0.5 | 0.5 | — |
| #B7 | — | <10 | 30 | <20 | — | 0.9 | 0.9 | — |
| #B8 | — | <10 | 48 | <20 | — | <0.5 | 0.5 | — |
| #B9 | — | <10 | 50 | <20 | — | 1.2 | 1.2 | none |
| #B10 | 50 μm thick Composition #B2 | 29 | 50 | 80 | good | 1.7 | 1.5 | none |

As can be appreciated from the description of the examples, the bonding film having an electromagnetic shielding and infrared blocking property according to the present invention can have a superior infrared blocking capability, and can be applied very closely to the object so that a favorable EMI shielding performance can be achieved substantially without any electromagnetic leakage. The present invention can provide superior bonding film which has favorable optical properties in terms of visible light transmission factor and invisibility, and involves very little change in the bonding properties at high temperatures over an extended period of time. By using polyethyleneterephthalate film for the transparent plastic member, a highly transparent, heat-resistant, economical and easy handling bonding film having an electromagnetically shielding and infrared blocking property can be obtained.

By using a layer of copper, aluminum or nickel having a thickness of 3 to 40 μm for the electroconductive material layer, and making the surface of the layer facing the transparent plastic base member into a coarse surface, a highly workable and economical bonding film which has an electromagnetically shielding and infrared blocking property can be obtained.

By using copper having at least its outer surface darkened, a fade-resistant and high-contrast bonding film which has an electromagnetically shielding and infrared blocking property can be obtained. By geometrically patterning the electroconductive material over the transparent plastic base member with a chemical etching process, a highly workable bonding film which has an electromagnetically shielding and infrared blocking property can be obtained.

By using paramagnetic metal for the electroconductive material, a bonding film having a high EMI shielding and infrared blocking property which is effective in shielding a magnetic field can be obtained.

When this bonding film is applied to a display device and an electromagnetic shielding assembly, a high EMI shielding effect can be obtained, and it becomes possible to allow the display device to be viewed as if no such bonding film were used without increasing the display intensity by virtue of the high visible light transmission factor. Also, it is possible to avoid any fauly operation of electronic equipment which uses an infrared remote control such as VTR, CD and radio sets. Furthermore, because the geometric pattern of the electroconductive material is virtually invisible, the display device can be viewed without any unfamiliar impression.

EXAMPLE

Bonding Film #C1

The plastic film consisted of transparent PET film having the thickness of 50 μm (refraction index n=1,575). An electrolytic copper foil having the thickness of 18 μm was laminated thereover, by heating, under the condition of 180° C. and 30 kgf/cm², via an epoxy bonding sheet (marketed by Nikkan Kogyo KK under the tradename of Nikaflex, n=1.58), serving as a bonding layer, with the coarse surface of the copper foil facing the epoxy bonding sheet.

The obtained PET film laminated with copper foil is subjected to a photo-lithographic process (including the steps of resist film coating, photographic exposure, photographic development, chemical etching, and resist film removal), and a copper grid pattern having the line width of 25 μm and the line spacing of 500 μm was formed on the surface of the PET film to obtain Composition #C1. A bonding agent which is described hereinafter was applied over the surface of Composition #C1 to the dry thickness of approximately 40 μm, and after a drying process, Bonding Film #C1 having an electromagnetic shielding property and an optical transparency was obtained. Thereafter, Bonding Film #C1 was applied over the surface of commercially available acrylic plate (marketed by KK Kurarc under the tradename of Komoglass, thickness 3 mm) by using a roll laminator under the temperature and pressure condition of 110° C. and 20 kgf/cm².

EXAMPLE

Bonding Film #C2

Aluminum foil having a thickness of 25 μm was bonded over the surface of PET film having the thickness of 25 μm serving as the transparent base material via acrylic bonding film (marketed by DuPont under the tradename of Pyralux LF-0200, n=1.47) by using a roll laminator under the temperature and pressure condition of 170° C. and 20 kgf/cm². This assembly consisting of PET film laminated with aluminum foil is subjected to a photo-lithographic process similar to that for Bonding Film #C1, and an aluminum grid pattern having the line width of 25 μm and the line spacing of 250 μm was formed on the surface of the PET film to obtain Composition #C2. A bonding agent which is described hereinafter was applied over the surface of Composition #C2 to the dry thickness of approximately 30 μm, and after a drying process, Bonding Film #C2 having an electromagnetic shielding property and an optical transparency was obtained. Thereafter, Bonding Film #C2 was applied over the surface of commercially available acrylic plate by using a thermal press under the temperature and pressure condition of 110° C., 30 kgf/cm² and 30 minutes.

EXAMPLE

Bonding Film #C3

Electroless nickel plating serving as electroconductive material was applied over the surface of PET film having the thickness of 50 μm by using a mask so as to form a nickel grid pattern having the line width of 12 μm, the line spacing of 500 μm, and the thickness of 2 μm to obtain Composition #C3. A bonding agent which is described hereinafter was applied over the surface of Composition #C3 to the dry thickness of approximately 70 μm, and after a drying process, Bonding film #C3 having an electromagnetic shielding property and an optical transparency was obtained. Thereafter, Bonding Film #C3 was applied over the surface of commercially available acrylic plate by using a roll laminator under the temperature and pressure condition of 110° C., 20 kgf/cm² and 30 minutes.

| <Bonding Agent Composition #C1> | |
|---|---|
| TBA-HME (Hitachi Kasei Kogyo KK; high polymer epoxy resin, Mw = 300,000) | 100 weight parts |
| YD-8125 (Toto Kasei Kogyo KK; bisphenol type A epoxy resin) | 25 weight parts |
| IPDI (Hitachi Kasei Kogyo KK; mask isophorone-di-isocyanate) | 12.5 weight parts |
| 2-ethyl-4-methylimidazole | 0.3 weight parts |
| MEK (methyl-ethyl-ketone) | 330 weight parts |
| cyclohexanone | 15 weight parts |

The bonding agent composition was dissolved in MEK and cyclohexanone to obtain a varnish of Bonding Agent Composition #C1. This varnish was allowed to freely extend over the surface of a glass sheet, and the film obtained after heating and drying had a refraction index of 1.57.

| <Bonding Agent Composition #C2> | |
|---|---|
| YP-30 (Toto Kasei KK, phenoxy resin, Mw = 60,000) | 100 weight parts |
| YD-8125 (Toto Kasei Kogyo KK; bisphenol type A epoxy resin) | 10 weight parts |
| IPDI (Hitachi Kasei Kogyo KK; mask-isophorone-di-isocyanate) | 5 weight parts |
| 2-ethyl-4-methylimidazole | 0.3 weight parts |
| MEK | 285 weight parts |
| cyclohexanone | 5 weight parts |

The bonding agent composition was dissolved in MEK and cyclohexanone to obtain a varnish of Bonding Agent Composition #C2. This varnish was allowed to freely extend over the surface of a glass sheet, and the film obtained after heating and drying had a refraction index of 1.55.

| <Bonding Agent Composition #C3> | |
|---|---|
| HTR-600LB (Teikoku Kagaku Sangyo KK, polyacrylic acid ester, Mw = 700,000) | 100 weight parts |
| Colonate L (Nihon Polyurethane Kogyo KK, 3-functional isocyanate) | 4.5 weight parts |
| dibutyl-tin laurate | 0.4 weight parts |
| toluen | 450 weight parts |
| ethylacetate | 10 weight parts |

The bonding agent composition was dissolved in tolune and ethylacetate to obtain a varnish of Bonding Agent Composition #C3. This varnish was allowed to freely extend over the surface of a glass sheet, and the film obtained after heating and drying had a refraction index of 1.47.

EXAMPLE #C1

Example #C1 consists of bonding film which was prepared according to the procedure for preparing Bonding Film Composition #C1 by using Bonding Agent Composition #C1.

EXAMPLE #C2

Example #C2 consists of bonding film which was prepared according to the procedure for preparing Bonding Film Composition #C2 by using Bonding Agent Composition #C2.

EXAMPLE #C3

Example #C3 consists of bonding film which was prepared according to the procedure for preparing Bonding Film Composition #C3 by using Bonding Agent Composition #C3.

EXAMPLE #C4

Example #C4 consists of bonding film which was identically prepared as Example #C1 except for that the line width was 35 µm instead of 25 µm.

EXAMPLE #C5

Example #C5 consists of bonding film which was identically prepared as Example #C2 except for that the line width was 12 µm instead of 25 µm.

EXAMPLE #C6

Example #C6 consists of bonding film which was identically prepared as Example #C3 except for that the line spacing was 800 µm instead of 500 µm.

EXAMPLE #C7

Example #C7 consists of bonding film which was identically prepared as Example #C1 except for that the line spacing was 250 µm instead of 500 µm.

EXAMPLE #C8

Example #C8 consists of bonding film which was identically prepared as Example #C2 except for that the line thickness was 35 µm instead of 25 µm.

EXAMPLE #C9

Example #C9 consists of bonding film which was identically prepared as Example #C1 except for that the electroconductive material consisted of darkened copper.

EXAMPLE #C10

Example #C10 consists of bonding film which was identically prepared as Example #C1 except for that the geometric pattern consisted of a repetition of a right triangle instead of the grid pattern of Example #C1.

EXAMPLE #C11

Example #C11 consists of bonding film which was identically prepared as Example #C1 except for that the geometric pattern consisted of a repetition of a right hexagon instead of the grid pattern of Example #C1.

EXAMPLE #C12

Example #C12 consists of bonding film which was identically prepared as Example #C1 except for that the geometric pattern consisted of a repetition of a right octagon and a square instead of the grid pattern of Example #C1.

COMPARATIVE EXAMPLE #C1

PET film over which ITO film was vapor deposited to the thickness of 2,000 Å by vapor deposition, instead of the patterned copper foil, was used. A bonding agent was directly applied over the assembly without geometrically patterning the ITO film. Thereafter, bonding film was prepared therefrom in the same way as Example #C1 to obtain Comparative Example #C1.

COMPARATIVE EXAMPLE #C2

Transparent PET film serving as the transparent plastic base member, over which aluminum film serving as the electroconductive material was vapor deposited to the thickness of 2,000 Å, was used. Bonding Agent Composition #C2 was directly applied over the surface of the assembly without geometrically patterning the aluminum film. Thereafter, bonding film was prepared therefrom in the same way as Example #C1 to obtain Comparative Example #C2.

COMPARATIVE EXAMPLE #C3

Comparative Example #C3 consisted of bonding film which was prepared identically as the bonding film of Example #C1 except for that the line width was 50 μm instead of 25 μm.

COMPARATIVE EXAMPLE #C4

Comparative Example #C4 consisted of bonding film which was prepared identically as the bonding film of Example #C2 except for that the line spacing was 150 μm instead of 250 μm.

COMPARATIVE EXAMPLE #C5

Comparative Example #C5 consisted of bonding film which was prepared identically as the bonding film of Example #C2 except for that the line thickness was 70 μm instead of 25 μm.

COMPARATIVE EXAMPLE #C6

Comparative Example #C6 consisted of bonding film which was prepared identically as the bonding film of Example #C1 except for that phenol-formaldehyde (Mw=50,000, n=1.73) was used as the bonding agent.

COMPARATIVE EXAMPLE #C7

Comparative Example #C7 consisted of bonding film which was prepared identically as the bonding film of Example #C3 except for that polydimethylsiloxane (Mw=45,000, n=1.43) was used as the bonding agent.

COMPARATIVE EXAMPLE #C8

Comparative Example #C8 consisted of bonding film which was prepared identically as the bonding film of Example #C3 except for that polyvinylidenefluoride (Mw=12,000, n=1.42) was used as the bonding agent.

COMPARATIVE EXAMPLE #C9

Comparative Example #C9 consisted of bonding film which was prepared identically as the bonding film of Example #C1 except for that polyethylene film containing a filler and having a thickness of 60 μm (with a visible light transmission factor of 20% or less) was used as the transparent plastic base member.

The EMI shielding performance, visible light transmission factor, invisibility, bonding property before and after heating, and fading property were actually measured, and the measured results are summarized in Tables 5 and 6.

TABLE 5

| Examples | method for forming conductive layer | transparent plastic base member | electro-conductive material | 14-1a geometric pattern | | | | | bonding agent |
|---|---|---|---|---|---|---|---|---|---|
| | | | | pattern | forming method | line width (μm) | line spacing (μm) | line thickness (μm) | |
| #C1 | foil bonding | PET (50 μm) | Cu | square | chemical etching | 25 | 500 | 18 | Bonding Agent #C1 (high polymer epoxy, n = 1.57) |
| #C2 | foil bonding | PET (25 μm) | Al | square | chemical etching | 25 | 250 | 25 | Bonding Agent #C2 (phenoxy resin, n = 1.55) |
| #C3 | drawing | PET (50 μm) | Ni | square | plating | 12 | 500 | 2 | Bonding Agent #C3 (acrylic resin, n = 1.47) |
| #C4 | foil bonding | PET (50 μm) | Cu | square | chemical etching | 35 | 500 | 18 | Bonding Agent #C1 |
| #C5 | foil bonding | PET (25 μm) | Al | square | chemical etching | 12 | 250 | 25 | Bonding Agent #C2 |
| #C6 | drawing | PET (50 μm) | Ni | square | plating | 12 | 800 | 2 | Bonding Agent #C3 |
| #C7 | foil bonding | PET (50 μm) | Cu | square | chemical etching | 25 | 250 | 18 | Bonding Agent #C1 |
| #C8 | foil bonding | PET (25 μm) | Al | square | chemical etching | 25 | 250 | 35 | Bonding Agent #C2 |
| #C9 | foil bonding | PET (50 μm) | darkened Cu | square | chemical etching | 25 | 500 | 18 | Bonding Agent #C1 |
| #C10 | foil bonding | PET (50 μm) | Cu | right triangle | chemical etching | 25 | 500 | 18 | Bonding Agent #C1 |
| #C11 | foil bonding | PET (50 μm) | Cu | right hexagon | chemical etching | 25 | 500 | 18 | Bonding Agent #C1 |
| #C12 | foil bonding | PET (50 μm) | Cu | right octagon + square | chemical etching | 25 | 500 | 18 | Bonding Agent #C1 |

| | 14-1b | | | | | |
|---|---|---|---|---|---|---|
| | Optical properties | | | bonding properties | | |
| Examples | HMI shielding (dB) | visibile light transmission factor (%) | invisibility | initial bonding force (kg/cm²) | bonding force after 80° C., 1,000 hrs of aging (kg/cm²) | fading after 80° C., 1,000 hrs of aging |
| #C1 | 50 | 75 | good | 1.2 | 1.2 | none |
| #C2 | 40 | 70 | good | 1.7 | 1.5 | none |
| #C3 | 48 | 72 | good | 0.9 | 0.8 | none |
| #C4 | 56 | 70 | good | 1.2 | 1.2 | none |
| #C5 | 38 | 78 | good | 1.7 | 1.6 | none |
| #C6 | 30 | 80 | good | 1.7 | 1.5 | none |
| #C7 | 55 | 73 | good | 1.2 | 1.2 | none |
| #C8 | 56 | 70 | good | 1.7 | 1.5 | none |
| #C9 | 48 | 72 | good | 1.2 | 1.2 | none |
| #C10 | 54 | 70 | good | 1.2 | 1.2 | none |
| #C11 | 50 | 77 | good | 1.2 | 1.2 | none |
| #C12 | 48 | 79 | good | 1.2 | 1.2 | none |

TABLE 6

| Comparative Examples | method for forming conductive layer | transparent plastic base member | electro-conductive material | 14-2b geometric pattern | | | | | bonding agent |
|---|---|---|---|---|---|---|---|---|---|
| | | | | pattern | forming method | line width (μm) | line spacing (μm) | line thickness (μm) | |
| #C1 | vapor deposition | PET (50 μm) | ITO | | uniform vapor deposition | — | — | 0.2 | Bonding Agent #C1 |
| #C2 | vapor deposition | PET (25 μm) | Al | | uniform vapor deposition | — | — | 0.2 | Bonding Agent #C2 |
| #C3 | foil bonding | PET (50 μm) | Cu | square | chemical etching | 50 | 500 | 18 | Bonding Agent #C1 |

TABLE 6-continued

| | | | | | | | | | |
|---|---|---|---|---|---|---|---|---|---|
| #C4 | foil bonding | PET (25 μm) | Al | square | chemical etching | 25 | 150 | 25 | Bonding Agent #C2 |
| #C5 | foil bonding | PET (25 μm) | Al | square | plating | 25 | 250 | 70 | Bonding Agent #C2 |
| #C6 | foil bonding | PET (50 μm) | Cu | square | chemical etching | 25 | 500 | 18 | phenol-formaldehyde (n = 1.73) |
| #C7 | foil bonding | PET (50 μm) | Ni | square | plating | 12 | 500 | 2 | polydimethylsiloxane (n = 1.43) |
| #C8 | drawing | PET (50 μm) | Ni | square | plating | 12 | 500 | 2 | polyvinylidiene fluoride (n = 1.43) |
| #C9 | foil bonding | polyethylene with filler (60 μm) | Cu | square | chemical etching | 25 | 500 | 18 | Bonding Agent #C1 |

14-2b

| | | optical properties | | | bonding properties | | |
|---|---|---|---|---|---|---|---|
| | | 4 visible light | | | | | |
| Comparative Examples | EMI shielding (dB) | transmission factor (%) | invisibility | initial bonding force (kg/cm$^2$) | bonding force after 80° C., 1,000 hrs of aging (kg/cm$^2$) | fading after 80° C., 1,000 hrs of aging | |
| #C1 | 18 | 83 | good | 1.2 | 1.2 | none | |
| #C2 | 35 | <20 | NG | 1.7 | 1.5 | none | |
| #C3 | 39 | 55 | NG | 1.2 | 1.2 | none | |
| #C4 | 37 | 40 | NG | 1.7 | 1.5 | none | |
| #C5 | 45 | 60 | NG | 0.9 | 0.8 | none | |
| #C6 | 50 | <20 | — | <0.5 | 0.5 | — | |
| #C7 | 30 | <20 | — | 0.9 | 0.9 | — | |
| #C8 | 48 | <20 | — | <0.5 | 0.3 | — | |
| #C9 | 50 | <20 | — | 1.2 | 1.2 | none | |

The EMI shielding performance was measured by placing the specimen between two flanges of a coaxial waveguide converter (marketed by Nihon Koshuha KK under the tradename of TWC-S-024), and using a spectro-analyzer (marketed by YHP under the tradename of 8510B Vector Network Analyzer) at the frequency of 1 GHz.

The visible light transmission factor was measured as an average value of the transmission factor over the wavelength range of 400 to 800 nm by using a double beam spectrophotoanalyzer (marketed by KK Hitachi under the tradename of Type 200-10).

The invisibility was measured by placing the display device at the distance of 0.5 m, evaluating if the geometric pattern of the electroconductive metallic material is visible or not. The specimens were graded into "very good", and "good" depending on the degree of invisibility, and "NG" when the pattern was visible.

The bonding property was measured by using a tensile strength testing machine (marketed by Toyo Baldwin KK under the tradename of Tensilon UTM-4-100) with the width of 10 nm, 90 degree direction and peeling speed of 50 mm/minute.

The refraction index was measured by using a refraction meter (marketed by KK Atago Kogaku Kikai Seisakusho under the tradename of Abbe refraction meter) at the temperature of 25° C.

As can be appreciated from the description of the examples, the bonding film having an electromagnetic shielding and optically transparent property according to the present invention can be applied very closely to the object so that a favorable EMI shielding performance can be achieved substantially without any electromagnetic leakage. The present invention can provide superior bonding film which has favorable optical properties in terms of visible light transmission factor and invisibility, and involves very little change in the bonding properties at high temperatures over an extended period of time. By using polyethyleneterephthalate film for the transparent plastic member, a highly transparent, heat-resistant, economical and easy handling bonding film having an electromagnetically shielding and optically transparent property can be obtained.

By using a layer of copper, aluminum or nickel having a thickness of 3 to 40 μm for the electroconductive material layer, and making the surface of the layer facing the transparent plastic base member into a coarse surface, a highly workable and economical bonding film which has an electromagnetically shielding and optically transparent property can be obtained.

By using copper having at least its outer surface darkened, a fade-resistant and high-contrast bonding film which has an electromagnetically shielding and optically transparent property can be obtained. By geometrically patterning the electroconductive material over the transparent plastic base member with a chemical etching process, a highly workable bonding film which has an electromagnetically shielding and optically transparent property can be obtained.

By using paramagnetic metal for the electroconductive material, a bonding film having a high EMI shielding and infrared blocking property which is effective in shielding a magnetic field can be obtained.

When this bonding film is applied to a display device and an electromagnetic shielding assembly, a high EMI shielding effect can be obtained, and it becomes possible to allow the display device to be viewed as if no such bonding film were used without increasing the display intensity by virtue of the high visible light transmission factor. Furthermore, because the geometric pattern of the electroconductive material is virtually invisible, the display device can be viewed without any unfamiliar impression.

EXAMPLE

Bonding Film #D1

The transparent plastic base sheet consisted of transparent PET film having the thickness of 50 μm (refraction index n=1,575). An electrolytic copper foil having the thickness of 12 μm was laminated thereover, by heating, under the condition of 180° C. and 30 kgf/cm$^2$, via an epoxy bonding film (marketed by Nikkan Kogyo KK under the tradename of Nikaflex, n=1.58), serving as a bonding layer, with the coarse surface of the copper foil facing the epoxy bonding film.

The obtained PET film laminated with copper foil is subjected to a photo-lithographic process (including the steps of resist film coating, photographic exposure, photographic development, chemical etching, and resist film removal), and a copper grid pattern having the line width 25 μm and the line spacing of 1 mm was formed on the surface of the PET film to obtain Composition #D1. The visible light transmission factor of Composition #D1 was 20% or less. A bonding agent which is described hereinafter was applied over the surface of Composition #D1 to the dry thickness of approximately 20 μm, and after a drying process, Bonding Film #D1 was obtained. Thereafter, a pair commercially available acrylic plates (marketed by KK Kurare under the tradename of Komoglass, thickness 1 mm) were laminated over either side of Bonding Film #D1 by using a roll laminator under the temperature and pressure condition of 110° C. and 20 kgf/cm$^2$ to obtain electromagnetic shielding material.

EXAMPLE

Bonding Film #D2

Copper foil having the thickness of 12 μm was bonded over the surface of PET film having the thickness of 25 μm serving as the transparent base material via acrylic bonding film (marketed by DuPont under the tradename of Pyralux LF-0200, n=1.47, thickness 20 μm). This assembly consisting of PET film laminated with copper foil is subjected to a photo-lithographic process similar to that for Bonding Film #D1, and an copper grid pattern having the line width of 15 μm and the line spacing of 2.0 mm was formed on the surface of the PET film to obtain Composition #D2. The visible light transmission factor of Composition #D2 was 20% or less. A bonding agent which is described hereinafter was applied over the surface of Composition #D2 carrying the geometric pattern to the dry thickness of approximately 30 μm, and was dried. Then, the bonding agent which is described hereinafter was applied to the other surface of the Composition #D2 to the dry thickness of approximately 20 μm to obtain Bonding Film #D2. Thereafter, a pair of commercially available acrylic plates (marketed by KK Kurare under the tradename of Komoglass, thickness 1.5 mm) were laminated over either side of Bonding Film #D2 by using a press under the temperature and pressure condition of 110° C. and 30 kgf/cm$^2$ to obtain electromagnetic shielding material.

EXAMPLE

Bonding Film #D3

Electroless nickel plating was applied over the surface of PET film having the thickness of 50 μm by using a mask so as to form a nickel grid pattern having the line width of 10 μm, the line spacing of 1.0 mm, and the thickness of 30 μm to obtain a Composition #D3. The visible light transmission factor of Composition #D3 was 20% or less. A bonding agent which is described hereinafter was applied over the surface of Composition #D3 carrying the geometrically patterned nickel layer to the dry thickness of approximately 30 μm, and was dried. Then, the bonding agent which is described hereinafter was applied to the other surface of the Composition #D2 to the dry thickness of approximately 20 μm to obtain Bonding Film #D3. Thereafter, a pair of commercially available acrylic plates (marketed by KK Kurare under the tradename of Komoglass, thickness 1.5 mm) were laminated over either side of Bonding Film #D3 by using a press under the temperature and pressure condition of 110° C. and 20 kgf/cm$^2$ to obtain electromagnetic shielding material.

| <Bonding Agent Composition #D1> | |
|---|---|
| TBA-HME (Hitachi Kasei Kogyo KK; high polymer epoxy resin, Mw = 300,000) | 100 weight parts |
| YD-8125 (Toto Kasei Kogyo KK; bisphenol type A epoxy resin) | 25 weight parts |
| IPDI (Hitachi Kasei Kogyo KK; mask isophorone-di-isocyanate) | 12.5 weight parts |
| 2-ethyl-4-methylimidazole | 0.3 weight parts |
| MEK (methyl-ethyl-ketone) | 330 weight parts |
| cyclohexanone | 15 weight parts |

The refraction index of Bonding Agent Composition #D1 after drying the solvents was 1.57.

| <Bonding Agent Composition #D2> | |
|---|---|
| YP-30 (Toto Kasei KK, phenoxy resin, Mw = 60,000) | 100 weight parts |
| YD-8125 (Toto Kasei Kogyo KK; bisphenol type A epoxy resin) | 10 weight parts |
| IPDI (Hitachi Kasei Kogyo KK; mask-isophorone-di-isocyanate) | 5 weight parts |
| 2-ethyl-4-methylimidazol | 0.3 weight parts |
| MEK | 285 weight parts |
| cyclohexanone | 5 weight parts |

The refraction index of Bonding Agent Composition #D2 after drying the solvents was 1.55.

| <Bonding Agent Composition #D3> | |
|---|---|
| HTR-600LB (Teikoku Kagaku Sangyo KK, polyacrylic acid ester, Mw = 700,000) | 100 weight parts |
| Colonate L (Nihon Polyurethane Kogyo KK, 3-functional isocyanate) | 4.5 weight parts |
| dibutyl-tin laurate | 0.4 weight parts |
| toluen | 450 weight parts |
| ethylacetate | 10 weight parts |

The refraction index of Bonding Agent Composition #D2 after drying the solvents was 1.47.

Example #D1

Example #D1 consists of electromagnetic shielding material which was prepared according to the procedure for preparing Bonding Film #D1 by using Bonding Agent Composition #D1.

Example #D2

Example #D2 consists of electromagnetic shielding material which was prepared according to the procedure for preparing Bonding Film #D2 by using Bonding Agent Composition #D2.

Example #D3

Example #D3 consists of electromagnetic shielding material which was prepared according to the procedure for preparing Bonding Film #D3 by using Bonding Agent Composition #D3.

Example #D4

Example #D4 consists of electromagnetic shielding material which was identically prepared as Example #D1 except for that the line width was 9 μm instead of 20 μm.

Example #D5

Example #D5 consists of electromagnetic shielding material which was identically prepared as Example #D2 except for that the line width was 12 μm instead of 15 μm.

Example #D6

Example #D6 consists of electromagnetic shielding material which was identically prepared as Example #D3 except for that the line spacing was 0.5 μm instead of 1.0 mm.

Example #D7

Example #D7 consists of electromagnetic shielding material which was identically prepared as Example #D1 except for that the line spacing was 5.0 mm instead of 1.0 mm.

Example #D8

Example #D8 consists of electromagnetic shielding material which was identically prepared as Example #D2 except for that the line thickness was 18 μm instead of 12 μm.

Example #D9

Example #D9 consists of electromagnetic shielding material which was identically prepared as Example #D1 except for that the electroconductive material consists of darkened copper.

Example #D10

Example #D10 consists of electromagnetic shielding material which was identically prepared as Example #D1 except for that the geometric pattern of copper foil consists of a repetition of a right triangle instead of the grid pattern of Example #D1.

Example #D11

Example #D11 consists of electromagnetic shielding material which was identically prepared as Example #D2 except for that the geometric pattern consisted of a repetition of a right hexagon instead of the copper grid pattern of Example #D2.

Example #D12

Example #D12 consists of electromagnetic shielding material which was identically prepared as Example #D3 except for that the geometric pattern consisted of a repetition of a right octagon and a square instead of the nickel grid pattern of Example #D3.

Example #D13

Example #D13 consists of electromagnetic shielding material which was identically prepared as Example #D1 except for that the plastic base member consisted of polysulfone (50 μm, n=1.633) instead of PET.

Comparative Example #D1

PET film over which ITO film was vapor depositioned to the thickness of 2,000 Å by vapor deposition, instead of the patterned copper foil, was used. Bonding Agent Composition #D1 was directly applied over the two sides of the assembly without geometrically patterning the ITO film. Thereafter, electromagnetic shielding material was prepared therefrom in the same way as Example #D1 to obtain Comparative Example #D1.

Comparative Example #D2

Transparent PET film having aluminum film entirely vapor deposited on one surface thereof was used without any geometric patterning. Bonding Agent Composition #D2 was directly applied over the two sides of the assembly. Thereafter, electromagnetic shielding material was prepared therefrom in the same way as Example #D1 to obtain Comparative Example #D2.

Comparative Example #D3

Comparative Example #D3 consisted of electromagnetic shielding material which was prepared identically as the electromagnetic shielding material of Example #D1 except for that the line width was 50 μm instead of 20 μm.

Comparative Example #D4

Comparative Example #D4 consisted of electromagnetic shielding material which was prepared identically as the electromagnetic shielding material of Example #D2 except for that the line spacing was 0.25 mm instead of 2.0 mm.

Comparative Example #D5

Comparative Example #D5 consisted of electromagnetic shielding material which was prepared identically as the electromagnetic shielding material of Example #D2 except for that the line thickness was 70 μm instead of 12 μm.

Comparative Example #D6

Comparative Example #D6 consisted of electromagnetic shielding material which was prepared identically as the electromagnetic shielding material of Example #D2 except for that polyethylene film containing a filler (with a visible transmission factor of 20% or less) was used for the transparent plastic film.

Comparative Example #D7

An assembly was prepared by applying Bonding Agent Composition #D1 only on the surface of the Composition #D1 carrying the electroconductive material according to the procedure for preparing Example 1 to the dry thickness of 30 μm, and, after drying Bonding Agent Composition #D1, was attached to an acrylic plate having the thickness of 2.0 mm instead of the acrylic plate of Example #D1.

Comparative Example #D8

A pair of acrylic plates were used instead of the acrylic plates of Example 2, and the thickness of the upper plate was 1.5 mm while that of the lower plate was 1.0 mm.

Reference Example #D1

Reference Example #D1 consisted of electromagnetic shielding material which was prepared identically as the electromagnetic shielding material of Example #D1 except for that phenol-formaldehyde resin (Mw=50,000, n=1.73) was used as the bonding agent.

Reference Example #D2

Reference Example #D2 consisted of electromagnetic shielding material which was prepared identically as the electromagnetic shielding material of Example #D3 except for that polydimethylsiloxane (Mw=45,000, n=1.43) was used as the bonding agent.

Reference Example #D3

Reference Example #D3 consisted of electromagnetic shielding material which was prepared identically as the electromagnetic shielding material of Example #D3 except for that polyvinylidenefluoride (Mw=120,000, n=1.42) was used as the bonding agent.

The EMI shielding performance, visible light transmission factor, warp-resistance, invisibility, optical distortion, bonding property before and after heating, and fading property of the thus obtained electromagnetic shielding material were actually measured, and the measured results are summarized in Tables 7 and 8.

The EMI shielding performance was measured by placing the specimen between two flanges of a coaxial waveguide converter (marketed by Nihon Koshuha KK under the tradename of TWC-S-024), and using a spectro-analyzer (marketed by YHP under the tradename of 8510B Vector Network Analyzer) at the frequency of 1 GHz.

The visible light transmission factor was measured as an average value of the transmission factor over the wavelength range of 400 to 800 nm by using a double beam spectrophotoanalyzer (marketed by KK Hitachi under the tradename of Type 200-10).

The invisibility and optical distortion were measured by placing the display device at the distance of 0.5 m, and evaluating if the geometric pattern of the electroconductive metallic material is visible or not, and if the image is distorted or not. The specimens were graded into "very good", and "good" depending on the degree of invisibility, and "NG" when the pattern was visible, and into "NG" and "good" depending on the presence of any detectable image distortion.

The bonding property was measured by using a tensile strength testing machine (marketed by Toyo Baldwin KK under the tradename of Tensilon UTM-4-100) with the width of 10 mm, 90 degree direction and peeling speed of 50 mm/minute.

The refraction index was measured by using a refraction meter (marketed by KK Atago Kogaku Kikai Seisakusho under the tradename of Abbe refraction meter) at the temperature of 25° C.

TABLE 7

| items | #D1 | #D2 | #D3 | #D4 | #D5 | #D6 | #D7 | #D8 | #D9 | #D10 | #D11 | #D12 | #D13 |
|---|---|---|---|---|---|---|---|---|---|---|---|---|---|
| method of forming conductive layer | foil bonding | foil bonding | drawing | foil bonding | foil bonding | drawing | foil bonding | foil bonding | foil bonding | foil bonding | foil bonding | drawing | foil bonding |
| conductive material | Cu | Cu | Ni | Cu | Cu | Ni | Cu | Cu | darkened Cu | Cu | Cu | NI | Cu |
| plastic film | PET | PET | PET | PET | PET | PET | PET | PET | PET | PET | PET | PET | polysulfone |
| shape | square | square | square | square | square | square | square | square | square | right triangle | right hexagon | octagon + square | square |
| patterning method *1 | CE | CE | M | CE | CE | M | CE | CE | CE | CE | CE | M | CE |
| line width (μm) | 20 | 15 | 10 | 9 | 12 | 10 | 20 | 15 | 20 | 20 | 15 | 10 | 20 |
| line spacing (μm) | 1000 | 2000 | 1000 | 1000 | 2000 | 500 | 5000 | 2000 | 1000 | 1000 | 2000 | 1000 | 1000 |
| line thickness (μm) | 12 | 12 | 3 | 12 | 12 | 3 | 12 | 18 | 12 | 12 | 12 | 3 | 12 |
| bonding agent composition *2 | 1 | 2 | 3 | 1 | 2 | 3 | 1 | 2 | 1 | 1 | 2 | 3 | 1 |
| EMI shielding performance | 40 | 35 | 40 | 38 | 33 | 44 | 33 | 35 | 40 | 41 | 39 | 38 | 40 |
| visible light transmission factor (%) | 74 | 75 | 72 | 70 | 75 | 68 | 70 | 74 | 74 | 70 | 76 | 72 | 66 |
| invisibility | good | good | good | good | good | good | good | good | very good | good | good | good | good |
| view clarity | good | good | good | good | good | good | good | good | good | good | good | good | good |
| warping (mm) | none | none | none | none | none | none | none | none | none | none | none | none | none |
| initial bonding force (kgf/cm$^2$) | 1.2 | 1.7 | 0.9 | 1.2 | 1.7 | 0.9 | 1.2 | 1.7 | 1.2 | 1.2 | 1.7 | 0.9 | 1.2 |
| bonding force after 80° C.-1,000 hrs of aging | 1.2 | 1.5 | 0.8 | 1.2 | 1.6 | 0.8 | 1.2 | 1.5 | 1.2 | 1.2 | 1.4 | 0.7 | 1.2 |

*1 CE: chemical deposition, M: plating
*2 #D1: Bonding Agent Composition #D1, #D2: Bonding Agent Composition #D2, and #D3: Bonding Agent Composition #D3.

TABLE 8

| items | Reference Examples | | | | | | | | Comparative Examples | | |
|---|---|---|---|---|---|---|---|---|---|---|---|
| | #D1 | #D2 | #D3 | #D4 | #D5 | #D6 | #D7 | #D8 | #D1 | #D2 | #D3 |
| method of forming conductive layer | vapor deposition | vapor deposition | foil bonding | foil bonding | foil bonding | foil bonding | foil bonding | foil bonding | foil bonding | drawing | drawing |
| conductive material | ITO | Al | Cu | Cu | Cu | Cu | Cu | Cu | Cu | Ni | Ni |
| plastic film | PET | PET | PET | PET | PET | PE with filler | PET | PET | PET | PET | PET |
| shape | entire surface | entire surface | square | square | square | square | square | square | square | square | square |
| patterning method *1 | — | — | CE | CE | CE | CE | CE | CE | CE | M | M |
| line width (μm) | — | — | 50 | 15 | 15 | 20 | 20 | 15 | 20 | 10 | 10 |
| line spacing (μm) | — | — | 1000 | 250 | 2000 | 1000 | 1000 | 2000 | 1000 | 1000 | 1000 |
| line thickness (μm) | 0.2 | 0.2 | 12 | 12 | 70 | 12 | 12 | 12 | 12 | 3 | 3 |
| bonding agent composition *2 | 1 | 2 | 1 | 2 | 2 | 1 | 1 | 2 | phenol-formaldehyde | poly-dimethyl-siloxane | polyvinyl-idiene-fluoride |
| emi shielding performance | 18 | 35 | 43 | 50 | 35 | 40 | 40 | 35 | 40 | 40 | 40 |
| visible light transmissivity (%) | 85 | 20> | 65 | 40 | 73 | 20> | 72 | 75 | 20> | 20> | 20> |
| invisibility | good | NG | NG | NG | NG | good | good | good | — | — | — |
| ? | ? | good | good | NG | NG | NG | NG | good | good | NG | NG | NG |
| ? | none | none | none | none | none | none | large | large | none | none | none |
| initial bonding force (kgf/cm²) | 1.2 | 1.7 | 1.2 | 1.7 | 1.6 | 1.2 | 1.2 | 1.7 | 0.5> | 0.9 | 0.5> |
| bonding force after 80° C.-1,000 hrs of aging | 1.2 | 1.5 | 1.2 | 1.5 | 1.5 | 1.2 | 1.2 | 1.5 | 0.5 | 0.9 | 0.5 |

*1 CE: chemical deposition, M: plating
*2 #D1: Bonding Agent Composition #D1, #D2: Bonding Agent Composition #D2, and #D3: Bonding Agent Composition #D3.

Comparative Examples #D1 and #D2 used vapor deposited ITO and Al, respectively, as the electroconductive material. ITO lacks a favorable electromagnetic shielding property, and Al lacks a favorable visible light transmission factor. Comparative Example #D3 lacked a favorable visible light transmission factor and invisibility because the line width was 50 μwhich is substantially larger than the upper limit of 25 μm which is required by the present invention. Similarly as Comparative Example #D3, Comparative Example #D4 lacked a favorable visible light transmission factor and invisibility because the line spacing was 250 μm which is substantially narrower than the lower limit of 500 μm which is required by the present invention. Comparative Example #D5 lacked a favorable invisibility because the line thickness was 70 μm which is substantially larger than the upper limit of 18 μm which is required by the present invention. Comparative Example #D6 had a poor visible light transmission factor of 20% or less because fairly opaque polyethylene film containing a filler (having a visible light transmission factor of 20% or less) was used instead of the transparent plastic film. Comparative Example #D7 had an undesired tendency to warp because the transparent plastic film was attached only to one side of the transparent plastic base sheet instead of attaching a pair of transparent plastic base sheet onto either side of the transparent plastic film each via a bonding agent layer. Comparative Example #D8 had an undesired tendency to warp because a pair of transparent plastic base sheets having unequal thicknesses were attached to either side of the transparent plastic film each via a bonding agent layer. On the other hand, the electromagnetic shielding material of Examples #D1 to #D13 according to the present invention features a pair of transparent plastic base sheets attached to either side of the transparent plastic film each via a bonding agent layer and has a favorable electromagnetic shielding performance of 33 dB or more. According to the present invention, the visible transmission factor is 66% or better, and a favorable invisibility can be achieved. Also, the initial bonding force is large and the bonding force drops very little even after 1,000 hours of aging test at 80° C. Also, the electromagnetic shielding material according to the present invention does not tend to warp. If the difference in refraction index between the bonding agent and the transparent plastic film or between the two bonding agents exceeds 0.14 as was the case with Reference Examples #D1 to #D3.

As can be appreciated from the description of the examples, the electromagnetic shielding material according to the present invention can have a high electromagnetic shielding property, free from leakage of electromagnetic radiation, and favorable optical properties in terms of visible light transmission factor, invisibility, and absence of distortion. It also is free from warping, and involves very little change in the optical properties at high temperatures over an extended period of time. By using polyethylene-terephthalate film for the transparent plastic film, a highly transparent, heat-resistant, economical and easy handling electromagnetic shielding material can be obtained.

By using a layer of copper, aluminum or nickel having a thickness of 3 to 18 μm for the electroconductive material layer, a highly workable and economical electromagnetic shielding material which additionally provides a wide viewing angle can be obtained.

By using copper having at least its outer surface darkened, a fade-resistant and high-contrast electromagnetic shielding material can be obtained. By geometrically patterning the electroconductive material over the transparent plastic base member with a chemical etching process, a highly workable electromagnetic shielding material can be obtained.

By using paramagnetic metal for the electroconductive material, a electromagnetic shielding material which is effective in shielding a magnetic field can be obtained. By using PMMA for the transparent plastic base sheet, a highly transparent and workable electromagnetic shielding material can be obtained. By selecting the materials such that the difference in refraction index between the transparent plastic base sheet and the bonding layer is 0.14 or less, a highly transparent electromagnetic shielding material can be obtained. When this electromagnetic shielding material is applied to a display device, a high EMI shielding effect can be obtained, and it becomes possible to allow the display device to be viewed comfortably with a high visible light transmission factor and a favorable invisibility.

<Surface Processed Film #E1>

$ZrO_2$ was vacuum deposited with the electron beam heating method, under the vacuum condition of 1 to $2\times10^{-4}$ Torr, onto the surface of polyethylene-terephthalate (PET) film having the thickness of 50 μm and the refraction index of 1.575, and $ZrO_2$ thin film having the thickness of approximately 650 Å and the refraction index of 2.05 was obtained. Additionally, $SiO_4$ thin film having the thickness of approximately 940 Å and the refraction index of 1.46 was formed over the $ZrO_2$ thin film with the electron beam heating method under the same condition to obtain Surface Processed Film #E1.

<Surface Processed Film #E2>

A bonding composition, consisting of 100 weight parts of YP-30 (marketed by Toto Kasei KK, Mw=60,000) consisting of phenoxy resin, 10 weight parts of YD-8125 (marketed by Toto Kasei Kogyo KK) consisting of bisphenol type A epoxy resin, 5 weight parts of IPDI (marketed by Hitachi Kasei Kogyo KK, mask-iisophronone-di-isocyanate; mask-isocyanate), 0.3 weight parts of a curing promoting agent consisting of 2-ethyl-4-methylimidazole, and 285 weight parts of methylethylketone (MEK) serving as a solvent, was mixed well with 20 weight parts of MEK dispersed coloidal silicasol (marketed by Nissan Kagaku Kogyo KK) and 0.05 weight parts of a silicone surface reactant by using a homogenizer. This composition was applied over the surface of transparent PET film having the thickness of 25 μm to the dry thickness of 2 μm by using an applicator to obtain Surface Processed Film #E2.

<Electromagnetic Shielding Film #E1>

By using Surface Processed Film #E1 for the transparent plastic film, an electrolytic copper foil having the thickness of 12 μm was laminated the transparent plastic film, by heating, under the condition of 180° C. and 30 kgf/cm², via an epoxy film (marketed by Nikkan Kogyo KK under the tradename of Nikaflex, n=1.58, thickness 20 μm), serving as a bonding layer, with the coarse surface of the copper foil facing the epoxy bonding film under the temperature and pressure condition of 180° C. and 30 kgf/cm². The obtained PET film laminated with copper foil is subjected to a photo-lithographic process (including the steps of resist film coating, photographic exposure, photographic development, chemical etching, and resist film removal), and a copper grid pattern having the line width of 20 μm and the line spacing of 1.0 mm was formed on the surface of the PET film to obtain Electromagnetic Shielding Film #E1.

<Electromagnetic Shielding Film #E2>

By using Surface Processed Film #E2 for the transparent plastic film, copper foil having the thickness of 12 μm was bonded over the surface of the transparent plastic film via acrylic bonding film (marketed by DuPont under the tradename of Pyralux LF-0200, n=1.47, thickness 20 μm). This assembly consisting of PET film laminated with copper foil is subjected to a photo-lithographic process similar to that for Electromagnetic Shielding Film #E1, and an copper grid pattern having the line width of 15 μm and the line spacing of 2.0 mm was formed on the surface of the PET film to obtain Electromagnetic Shielding Film #E2.

<Electromagnetic Shielding Film #E3>

By using Surface Processed Film #E2 for the transparent plastic film, electroless nickel plating was applied over the surface of the transparent plastic film by using a mask so as to form a nickel grid pattern having the line width of 10 μm, the line spacing of 1.0 mm, and the thickness of 3 μm to obtain Electromagnetic Shielding Film #E3

<Electromagnetic Shielding Film #E4>

The geometrically electroconductive material formed on Electromagnetic Shielding Film #E1 was covered by a bonding agent composition which is described hereinafter to the dry thickness of 30 μm.

| #<Bonding Agent Composition #E1> | |
| --- | --- |
| TBA-HME (Hitachi Kasei Kogyo KK; high polymer epoxy resin, Mw = 300,000) | 100 weight parts |
| YD-8125 (Toto Kasei Kogyo KK; bisphenol type A epoxy resin) | 25 weight parts |
| IPDI (Hitachi Kasei Kogyo KK; mask-isocyanate) | 12.5 weight parts |
| 2-ethyl-4-methylimidazole | 0.3 weight parts |
| MEK (methyl-ethyl-ketone) | 330 weight parts |
| cyclohexanone | 15 weight parts |

The refraction index of Bonding Agent Composition #E1 after drying the solvents was 1.57.

| <Bonding Agent Composition #E2> | |
| --- | --- |
| YP-30 (Toto Kasei KK, phenoxy resin, Mw = 60,000) | 100 weight parts |
| YD-8125 (Toto Kasei Kogyo KK; bisphenol type A epoxy resin) | 10 weight parts |
| | 10 weight parts |
| IPDI (Hitachi Kasei Kogyo KK; mask-isophorone-di-isocyanate) | 5 weight parts |
| 2-ethyl-4-methylimidazole | 0.3 weight parts |
| MEK | 285 weight parts |
| cyclohexanone | 5 weight parts |

The refraction index of Bonding Agent Composition #E2 after drying the solvents was 1.55.

| <Bonding Agent Composition #E3> | |
| --- | --- |
| HTR-600LB (Teikoku Kagaku Sangyo KK, polyacrylic acid ester, Mw = 700,000) | 100 weight parts |
| Colonate L (Nihon Polyurethane Kogyo KK, 3-functional isocyanate) | 4.5 weight parts |
| dibutyl-tin laurate | 0.4 weight parts |
| toluen | 450 weight parts |
| ethylacetate | 10 weight parts |

The refraction index of Bonding Agent Composition #E2 after drying the solvents was 1.47.

| <Infrared Blocking Layer Composition #E1> | |
| --- | --- |
| YD-8125 (Toto Kasei Kogyo KK; bisphenol type A epoxy resin) | 100 weight parts |
| copper (II) sulfide (Wako Junyaku KK, crushed to an average particle diameter of 0.5 μm by using a Henschel mixer) | 4 weight parts |
| 2-ethyl-3-methylimidazol | 0.5 weight parts |

-continued

<Infrared Blocking Layer Composition #E1>

| | |
|---|---|
| dicyandiamide | 5 weight parts |
| MEK | 200 weight parts |
| etyleneglycol-monomethyether | 20 weight parts |

The compound was applied with an applicator at room temperature, and was cured by heating at 90° C. for 30 minutes.

Infrared Blocking Layer Composition #E2>

| | |
|---|---|
| HTR-280 (Teikoku Kagaku Sangyo KK, polyacrylic acid ester copolymer, Mw = 700,000) | 100 weight parts |
| UFP-HX (Sumitomo Kinzoku Kozan KK, ITO, verage particle diameter 0.1 μm) | 0.5 weight parts |
| Colonate L (Nihon Polyurethane Kogyo KK, 3-functional isocyanate) | 5 weight parts |
| dibutyl-tin laurate | 0.4 weight parts |
| toluen | 450 weight parts |
| ethylacetate | 10 weight parts |

The compound was applied with an applicator at room temperature, and was cured by heating at 90° C. for 30 minutes.

<Infrared Blocking Layer Composition #E3>

| | |
|---|---|
| YP-30 (Toto Kasei KK, phenoxy resin, Mw = 60,000) | 100 weight parts |
| YD-8125 (Toto Kasei Kogyo KK; bisphenol type A epoxy resin) | 10 weight parts |
| IPDI (Hitachi Kasei Kogyo KK; mask-isocyanate) | 5 weight parts |
| MEK | 285 weight parts |
| IRG-022 (Nihon Kayaku KK, aromatic di-imonium salt) | 1 weight part |

The compound was applied with an applicator at room temperature, and was cured by heating at 90° C. for 30 minutes.

Example #E1

Electromagnetic Shielding Film #E1 and the bonding film obtained by applying Bonding Agent Composition #E1 over the surface of transparent PET film having the thickness of 50 μm to the dry thickness of approximately 20 μm and drying the assembly were bonded over two sides of a commercially available acrylic plate (marketed by KK Kurare under the tradename of Komoglass, thickness 1 mm) by using a roll laminator under the temperature and pressure condition of 110° C. and 20 kgf/cm² to obtain electromagnetic shielding material of Example #E1.

Example #E2

Electromagnetic Shielding Film #E2 and the bonding film obtained by applying Bonding Agent Composition #E2 over the surface of transparent PET film having the thickness of 50 μm to the dry thickness of approximately 20 μm and drying the assembly were bonded over two sides of a commercially available acrylic plate (marketed by KK Kurare under the tradename of Komoglass, thickness 1 mm) by using a roll laminator under the temperature and pressure condition of 110° C. and 10 kgf/cm² to obtain electromagnetic shielding material of Example #E2.

Example #E3

Example #E3 consisted of electromagnetic shielding material which was prepared in the same way as Example #E1 except for that Electromagnetic Shielding Film #E3 was used.

Example #E4

Electromagnetic Shielding Film #E4 covered by Bonding Agent Composition #E3 and the bonding film obtained by applying Bonding Agent Composition #E3 over the surface of transparent PET film having the thickness of 50 μm to the dry thickness of approximately 20 μm and drying the assembly were bonded over two sides of a commercially available acrylic plate (marketed by KK Kurare under the tradename of Komoglass, thickness 1 mm) by using roll laminator under the temperature and pressure condition of 110° C. and 20 kgf/cm² to obtain electromagnetic shielding material of Example #E4.

Example #E5

Example #E5 consists of electromagnetic shielding material which was identically prepared as Example #E1 except for that the line width was 12 μm instead of 20 μm.

Example #E6

Example #E6 consists of electromagnetic shielding material which was identically prepared as Example #E2 except for that the line spacing was 0.5 mm instead of 2.0 mm.

Example #E7

Example #E7 consists of electromagnetic shielding material which was identically prepared as Example #E4 except for that the line spacing was 5.0 mm instead of 1.0 mm.

Example #E8

Example #E8 consists of electromagnetic shielding material which was identically prepared as Example #E2 except for that the line thickness was 18 μm instead of 12 μm.

Example #E9

Example #E9 consists of electromagnetic shielding material which was identically prepared as Example #E1 except for that the electroconductive material consisted of darkened copper.

Example #E10

Example #E10 consists of electromagnetic shielding material which was identically prepared as Example #E1 except for that the geometric pattern of copper foil consisted of a repetition of a right triangle instead of the grid pattern of Example #E1.

Example #E11

Example #E11 consists of electromagnetic shielding material which was identically prepared as Example #E2 except for that the geometric pattern consisted of a repetition of a right hexagon instead of the grid pattern of Example #E2.

Example #E12

Example #E12 consists of electromagnetic shielding material which was identically prepared as Example #E3 except for that the geometric pattern consisted of a repetition of a right octagon and a square instead of the grid pattern of Example #E3.

Example #E13

Example #E13 consists of electromagnetic shielding material which was identically prepared as Example #E1 except for that the plastic base number consisted of polysulfone (50 μm) instead of PET.

Example #E14

Electromagnetic Shielding Film #E1 and the bonding film obtained by applying Infrared Blocking Layer Composition #E1 over the surface of transparent PET film having the thickness of 50 μm to the dry thickness of approximately 20 μm and drying the assembly were bonded over two sides of a commercially available acrylic plate (marketed by KK Kurare under the tradename of Komoglass, thickness 1 mm) by using a roll laminator under the temperature and pressure condition of 110° C. and 20 kgf/cm² to obtain electromagnetic shielding material of Example #E14.

Example #E15

Example #E15 consists of electromagnetic shielding material which is identically prepared as Example #E14 except for that Infrared Blocking Layer Composition #E2 was used.

Example #E16

Example #E15 consists of electromagnetic shielding material which was identically prepared as Example #E14 except for that Infrared Blocking Layer Composition #E3 was used.

Comparative Example #E1

ITO film was vapor deposited on the unprocessed surface of the transparent plastic film (thickness 50 μm) consisting of Surface Processed Film #E1 to the thickness of 2,000 Å by vapor deposition without geometric patterning. Bonding Agent Composition #E1 was directly applied over the vapor deposited side of the assembly to the dry thickness of 20 μm. Similarly as Example #E1, this assembly and the bonding film obtained by applying Bonding Agent Composition #E1 over the surface of transparent PET film having the thickness of 50 μm to the dry thickness of approximately 20 μm and drying the assembly were bonded over two sides of a commercially available acrylic plate (marketed by KK Kurare under the tradename of Komoglass, thickness 1 mm) under the temperature and pressure condition of 110° C. and 10 kgf/cm² to obtain electromagnetic shielding material of Comparative Example #E1.

Comparative Example #E2

Comparative Example #E2 consisted of electromagnetic shielding material which was prepared identically as the electromagnetic shielding material of Example #E1 except for that aluminum, instead of ITO, was deposited on the entire surface of the assembly, and Bonding Agent Composition #E2 was directly applied.

Comparative Example #E3

Comparative Example #E3 consisted of electromagnetic shielding material which was prepared identically as the electromagnetic shielding material of Example #E1 except for that the line width was 50 μm instead of 20 μm.

Comparative Example #E4

Comparative Example #E4 consisted of electromagnetic shielding material which was prepared identically as the electromagnetic shielding material of Example #E2 except for that the line spacing was 0.25 mm instead of 2.0 mm.

Comparative Example #E5

Comparative Example #E5 consisted of electromagnetic shielding material which was prepared identically as the electromagnetic shielding material of Example #E2 except for that the line thickness was 70 μm instead of 12 μm.

Comparative Example #E6

Comparative Example #E6 consisted of electromagnetic shielding material which was prepared identically as the electromagnetic shielding material of Example #E1 except for that phenol-formaldehyde resin (Mw=50,000, n=1.73) was used instead of Bonding Agent Composition #E1.

Comparative Example #E7

Comparative Example #E7 consisted of electromagnetic shielding material which was prepared identically as the electromagnetic shielding material of Example #E2 except for that polydimethylsiloxane (Mw=45,000, n=1.43) was used instead of Bonding Agent Composition #E1.

Comparative Example #E8

Comparative Example #E8 consisted of electromagnetic shielding material which was prepared identically as the electromagnetic shielding material of Example #E1 except for that polyvinylidenefluoride (Mw=120,000, n=1.42) was used instead of Bonding Agent Composition #E1.

Comparative Example #E9

Comparative Example #E9 consisted of electromagnetic shielding material which was prepared identically as the electromagnetic shielding material of Example #E1 except for that polyethylene film containing a filler (with a visible transmission factor of 20% or less) was used for the transparent plastic film.

Comparative Example #E10

Comparative Example #E10 consisted of electromagnetic shielding material which was prepared identically as the electromagnetic shielding material of Example #E2 except for that two layers of Electromagnetic Shielding Film #E2 were bonded to each other (without the PET film carrying the bonding agent on the other side).

The EMI shielding performance, visible light transmission factor, warp-resistance, invisibility, and bonding property before and after heating of the thus obtained electromagnetic shielding material were actually measured, and the measured results are summarized in Tables 9 and 10.

The EMI shielding performance was measured by placing the specimen between two flanges of a coaxial waveguide converter (marketed by Nihon Koshuha KK under the tradename of TWC-S-024), and using a spectro-analyzer (marketed by YHP under the tradename of 8510B Vector Network Analyzer) at the frequency of 1 GHz.

The visible light transmission factor was measured as an average value of transmission factor over the wavelength range of 400 to 800 nm by using a double beam spectrophotoanalyzer (marketed by KK Hitachi under the tradename of Type 200-10).

The invisibility was measured by placing the display device at the distance of 0.5 m, and evaluating if the geometric pattern of the electroconductive metallic material is visible or not. The specimens were graded into "very good", and "good" depending on the degree of invisibility.

The bonding property was measured by using a tensile strength testing machine (marketed by Toyo Baldwin KK under the tradename of Tensilon UTM-4-100) with the width of 10 mm, 90 degree direction and peeling speed of 50 mm/minute.

The refraction index was measured by using a refraction meter (marketed by KK Atago Kogaku Kikai Seisakusho under the tradename of Abbe refraction meter) at the temperature of 25° C.

The warping of the electromagnetic shielding material was measured by preparing a speciment of 650 mm by 100 mm, and measuring the amount of warping along the lengthwise direction of the speciment.

The haziness was measured by using a haze meter (marketed by Nihon Densyoku Kogyo KK under the tradename of COH-300A).

The reflective index was measured by using a spectrochromatic meter (marketed by Minolta KK under the tradename of CM-508d).

TABLE 9

| items | Examples | | | | | | | |
|---|---|---|---|---|---|---|---|---|
| | #E1 | #E2 | #E3 | #E4 | #E5 | #E6 | #E7 | #E8 |
| method for forming conductive layer | foil bonding | foil bonding | drawing | foil bonding | foil bonding | foil bonding | foil bonding | foil bonding |
| conductive material | Cu | Cu | Ni | Cu | Cu | Cu | Cu | Cu |
| bonding agent *1 | SAF | LE-0200 | — | SAF | SAF | LE-0200 | SAF | LE-0200 |
| bonding agent covering conductive pattern | — | — | — | 3 | — | — | 3 | — |
| shape | square | square | square | square | square | square | square | square |
| patterning method *2 | CE | CE | M | CE | CE | CE | CE | CE |
| line width (μm) | 20 | 15 | 10 | 20 | 12 | 15 | 20 | 15 |
| line spacing (μm) | 1000 | 2000 | 1000 | 1000 | 1000 | 500 | 5000 | 2000 |
| line thickness (μm) | 12 | 12 | 3 | 12 | 12 | 12 | 12 | 18 |
| surface processing | A | A | B | A | A | A | A | A |
| plastic film *4 | PET | PET | PET | PET | PET | PET | PET | PET |
| bonding agent composition *5 | 1 | 2 | 1 | 3 | 1 | 2 | 3 | 2 |
| EMI shield | 50 | 40 | 48 | 56 | 38 | 30 | 55 | 56 |
| visible light transmission factor (%) | 75 | 70 | 72 | 70 | 78 | 80 | 73 | 70 |
| invisibility | good | good | good | good | good | good | good | good |
| infrared blocking ratio (%) | — | — | — | — | — | — | — | — |
| haziness (%) | 3.5 | 3.3 | 3.5 | 3.7 | 3.3 | 3.2 | 3.3 | 3.5 |
| reflective index (%) | 5.2 | 5.3 | 5.1 | 4.9 | 5 | 5 | 5.2 | 5.5 |
| initial bonding force (kgf/cm$^2$) | 1.2 | 1.7 | 1.2 | 1.8 | 1.5 | 1.6 | 1.2 | 1.7 |
| bonding force after 80° C.- 1,000 hours of aging | 1.2 | 1.5 | 1.2 | 1.6 | 1.2 | 1.2 | 1.2 | 1.5 |
| warping (mm) | none | none | none | none | none | none | none | none |

| items | Examples | | | | | | | |
|---|---|---|---|---|---|---|---|---|
| | #9 | #10 | #11 | #12 | #13 | #14 | #15 | #16 |
| method for forming conductive layer | foil bonding | foil bonding | foil bonding | drawing | foil bonding | foil bonding | foil bonding | foil bonding |
| conductive material | darkened cu | Cu | Cu | Ni | Cu | Cu | Cu | Cu |
| bonding agent *1 | SAF | SAF | LF-0200 | — | SAF | SAF | SAF | SAF |
| bonding agent covering conductive pattern | — | — | — | — | — | — | — | — |
| shape | square | right triangle | right hexagon | octagon + square | square | square | square | square |
| patterning method *2 | CE | CE | CE | M | CE | CE | CE | CE |
| line width (μm) | 20 | 20 | 15 | 10 | 20 | 20 | 20 | 20 |
| line spacing (μm) | 1000 | 1000 | 2000 | 1000 | 1000 | 1000 | 1000 | 1000 |
| line thickness (μm) | 12 | 12 | 12 | 3 | 12 | 12 | 12 | 12 |
| surface processing | A | A | A | B | A | A | A | A |
| plastic film *4 | PET | PET | PET | PET | PS | PET | PET | PET |
| bonding agent composition *5 | #1 | #1 | #2 | #1 | #1 | Infra #1 | Infra #2 | Infra #3 |
| EMI shield | 48 | 54 | 50 | 48 | 56 | 48 | 54 | 50 |
| visible light transmission factor (%) | 72 | 70 | 70 | 70 | 70 | 70 | 70 | 70 |
| invisibility | good | good | good | good | good | good | good | good |
| infrared blocking ratio (%) | — | — | — | — | — | 90 | 90 | 98 |

TABLE 9-continued

| | | | | | | | | |
|---|---|---|---|---|---|---|---|---|
| haziness (%) | 3.5 | 3.3 | 3.3 | 3.6 | 3.5 | 3.7 | 3.7 | 3.7 |
| reflective index (%) | 5.3 | 5.1 | 4.8 | 4.8 | 4.5 | 5 | 5 | 5 |
| initial bonding force (kgf/cm$^2$) | 1.6 | 1.2 | 1.3 | 1.1 | 1.7 | 1.6 | 1.2 | 1.2 |
| bonding force after 80° C.-1,000 hours of aging | 1.4 | 1 | 1.1 | 1.1 | 1.5 | 1.3 | 1.2 | 1.2 |
| warping (mm) | none | none | none | none | none | none | none | none |

*1 SAF: Nikaflex SAF, LF-0200: Pyralux LF-0200
*2 CE: chemical deposition, M: plating
*3 A: Surface Processed PET Film #1, B: Surface Processed PET Film #2
*4 PET: 50 μm PET film, PS: 50 μm PS film.
*5 #1: Bonding Agent Composition #1, #2: Bonding Agent Composition #2, and #3: Bonding Agent Composition #3.
Infra #1: Infrared Blocking Layer Composition #1, Infra #2: Infrared Blocking Layer Composition #2, Infra #3: Infrared Blocking Layer Composition #3

TABLE 10

| | Comparative Examples | | | | | | | | | |
|---|---|---|---|---|---|---|---|---|---|---|
| items | #E1 | #E2 | #E3 | #E4 | #E5 | #E6 | #E7 | #E8 | #E9 | #E10 |
| method for forming conductive layer | vapor deposition | vapor deposition | foil bonding | foil bonding | foil bonding | foil bonding | foil bonding | foil bonding | foil bonding | foil bonding |
| conductive material | ITO | Al | Cu | Cu | Cu | Cu | Cu | Cu | Cu | Cu |
| bonding agent *1 | — | — | SAF | LF-0200 | LF-0200 | SAF | SAF | SAF | SAF | LE-0200 |
| bonding agent covering conductive pattern | — | — | — | #E3 | — | — | — | — | — | — |
| shape | uniform | uniform | square | square | square | square | square | square | square | square |
| patterning method *2 | vapor deposition | vapor deposition | CE | CE | CE | CE | CE | CE | CE | CE |
| line width (μm) | — | — | 50 | 15 | 15 | 20 | 20 | 20 | 20 | 15 |
| line spacing (μm) | — | — | 1000 | 250 | 2000 | 1000 | 1000 | 1000 | 1000 | 2000 |
| line thickness (μm) | — | — | 12 | 12 | 70 | 12 | 12 | 12 | 12 | 12 |
| surface processing | A | A | A | A | A | A | A | A | A | A |
| plastic film *4 | PET | PET | PET | PET | PET | PET | PET | PET | PE with filler | — |
| bonding agent composition *5 | #E1 | #E2 | #E1 | #E2 | #E2 | Bond #E1 | Bond #E2 | Bond #E3 | #E1 | — |
| EMI shield | 18 | 35 | 39 | 37 | 55 | 50 | 30 | 48 | 50 | — |
| visible light transmission factor (%) | 80 | 20> | 55 | 40 | 60 | 20> | 20> | 20> | 20> | 20> |
| invisibility | good | NG | NG | NG | NG | NG | — | — | — | — |
| infrared blocking ratio (%) | 10 | — | — | — | — | — | — | — | — | — |
| haziness (%) | 3.2 | 3.2 | 3 | 3.8 | 3.7 | 15.8 | 10.2 | 13.5 | 18.8 | — |
| reflective index (%) | 4.8 | 4.8 | 5.3 | 4.6 | 4.8 | 10 | 8.8 | 10.6 | 15.6 | — |
| initial bonding force (kgf/cm$^2$) | 1.2 | 1.2 | 1.2 | 1.2 | 1.7 | 1.6 | 1.1 | 1.5 | 1.1 | — |
| bonding force after 80° C.-1,000 hours of aging | 1.2 | 1.2 | 1.2 | 0.8 | 1.2 | 1.2 | 0.8 | 1.1 | 0.9 | — |
| warping (mm) | none | none | none | none | none | none | none | none | none | 20 |

*1 SAF: Nikaflex SAF, LF-0200: Pyralux LF-0200
*2 CE: chemical deposition, M: plating
*3 A: Surface Processed PET Film #E1, B: Surface Processed PET Film #E2
*4 PET: 50 μm PET film, PS: 50 μm PS film.
*5 #E1: Bonding Agent Composition #E1, #E2: Bonding Agent Composition #E2, and #E3: Bonding Agent Composition #E3.
Bond #E1: phenol-formaldehyde resin (n = 1.73), Bond #E2: polydimethylsiloxane (n = 1.43), and Bond #E3: polyvinylidienefluoride (n = 1.42)

Comparative Examples #E1 and #E2 used vapor deposited ITO and Al, respectively, as the electroconductive material, and lacks favorable electromagnetic shielding property. Comparative Example #E3 lacked a favorable visible light transmission factor and invisibility because the line width was 50 μm which is substantially larger than the upper limit of 25 μm which is required by the present invention. Similarly as Comparative Example #E3, Comparative Example #E4 lacked a favorable visible light transmission factor and invisibility because the line spacing was 250 μm which is substantially narrower than the lower limit of 500 μm which is required by the present invention. Comparative Example #E5 lacked a favorable invisibility because the line thickness was 70 μm which is substantially larger than the upper limit of 18 μm which is required by the present invention. Comparative Example #E9 had a poor visible light transmission factor of 20% or less because fairly opaque polyethylene film containing a filler (having a visible light transmission factor of 20% or less) was used instead of the transparent plastic film. Comparative Example #E10 has an undesired tendency to warp because the transparent plastic film was attached only to one side of the transparent plastic base sheet instead of attaching a pair of transparent plastic base sheet onto either side of the transparent plastic film each via a bonding agent layer. On the other hand, the present invention consists of electromagnetic shielding material, comprising a transparent plastic base sheet, and transparent plastic film layers attached to either side of the base sheet each via a bonding agent layer, one of the transparent plastic film layers carrying a geometrically patterned electroconductive material featuring a line width of 25 μm or less, a line spacing of 500 μm or more, and a line thickness of 18 μm or less. The electromagnetic shielding material of Examples #E1 to #E16 according to the present invention has a favorable electromagnetic shielding performance of 30 dB or more. According to the present invention, the visible transmission factor is 70% or better, and a favorable invisibility can be achieved. The values of haziness and reflective index are favorably low. Also, the initial bonding force is large and the bonding force drops very little even after 1,000 hours of aging test at 80° C. Also, the electromagnetic shielding material according to the present invention does not tend to warp. According to Examples #E14 to 16 which include an infrared blocking layer, the infrared blocking ratio is favorably 90% or more.

As can be appreciated from the description of the examples, the electromagnetic shielding material according to the present invention has a high electromagnetic shielding property, free from leakage of electromagnetic radiation, and favorable optical properties in terms of visible light transmission factor, invisibility, and absence of distortion. It also is free from warping, ad involves very little change in the optical properties at high temperatures over an extended period of time. Because the bonding film can be bonded onto the two sides of the transparent base sheet by using a roll laminator, the electromagnetic shielding material provided by the present invention allows a high productivity to be achieved. The electromagnetic shielding material may be given with an anti-reflection or anti-glare property by the anti-glare process or the anti-reflection process. The electromagnetic shielding material of the present invention may have an infrared blocking ratio of 90% or higher in the wavelength range of 900 to 1,100 nm by adding the infrared absorbing agent. A continuous production can be made possible by laminating the transparent plastic film over the transparent plastic base sheet by the roll laminating method. By using polyethylene-terephthalate film for the transparent plastic film, a highly transparent, heat-resistant, economical and easy handling electromagnetic shielding material can be obtained.

By using a layer of copper, aluminum or nickel having a thickness of 3 to 18 μm for the electroconductive material layer, a highly workable and economical electromagnetic shielding material which additionally provides a wide viewing angle can be obtained. By using copper having at least its outer surface darkened, a fade-resistant and high-contrast electromagnetic shielding material can be obtained. By geometrically patterning the electroconductive material over the transparent plastic base member with a chemical etching process, a highly workable electromagnetic shielding material can be obtained.

By using PMMA for the transparent plastic base sheet, a highly transparent and workable electromagnetic shielding material can be obtained.

By selecting the materials such that the difference in refraction index between the bonding layer and the transparent plastic base sheet (or the transparent plastic film or, in case the assembly attached to transparent plastic material, the bonding agent used for that purpose) is 0.14 or less, a highly transparent electromagnetic shielding material can be obtained.

When this electromagnetic shielding material is applied to a display device, a high EMI shielding effect can be obtained, and it becomes possible to allow the display device to be viewed comfortably with a high visible light transmission factor and a favorable invisibility, free from any haziness or reflection. Also, because the infrared radiation which may be emitted from the display device is effectively shut off, any faulty operation of equipment using remote controls can be avoided.

What we claim is:

1. A method for making an electromagnetic shielding bonding film, comprising:
   forming geometrically patterned electroconductive material having a line width of 40 μm or less, a line spacing of 200 μm or more, and a line thickness of 40 μm or less over a substantially transparent base film, the geometric pattern providing an aperture ratio of 80% or more;
   coating a bonding agent composition over a part or an entirety of at least one side of said base film, wherein a difference in the refraction index between said transparent base film and the bonding layer formed by said coated bonding agent is 0.14 or less;
   said base film being prepared as a roll web, and at least most of said steps are carried out in a continuous manner.

2. A method for making electromagnetic shielding bonding film according to claim 1, further comprising the step of forming an infrared blocking layer by using an infrared blocking composition having an absorption ratio of 50% or more for infrared light of 900 to 1,100 nm in wavelength at least on one side of said base film.

3. A method for making electromagnetic shielding bonding film according to claim 1, wherein said geometric patterned electroconductive material is formed by etching.

4. A method for making electromagnetic shielding bonding film according to claim 1, wherein said bonding agent composition has a refractive index of 1.45 to 1.60.

5. A method for making electromagnetic shielding bonding film according to claim 4, wherein said transparent base film consists of polyethylene-terephthalate film.

6. A method for making electromagnetic shielding bonding film according to claim 1, wherein said infrared blocking layer is incorporated in said coating of said bonding agent composition.

7. A method for making electromagnetic shielding bonding film according to claim 1, wherein said geometric patterned electroconductive material layer consists of a member selected from a group consisting of copper, aluminum and nickel layer.

8. A method for making electromagnetic shielding bonding film according to claim 7, wherein said geometric patterned electroconductive material has a thickness of 3 to 40 μm, and a surface of said transparent base film carrying said electroconductive material consists of a coarse surface having a surface roughness of 1 μm or more.

9. A method for making electromagnetic shielding bonding film according to claim 7, wherein said electroconductive material consists of copper which has a darkened surface.

10. A method for making electromagnetic shielding bonding film according to claim 1, wherein said electroconductive material consists of paramagnetic metallic material.

11. A display device using electromagnetic shielding bonding film which is made by the method according to any one of claims 1–10.

12. An electromagnetic shielding assembly incorporating electromagnetic shielding bonding film which is made by the method according to any one of claims 1–10.

13. A bonding film which has an optically transparent and electromagnetically shielding property, comprising:

a substantially transparent base film;

geometrically patterned electroconductive material formed at least on one side of said transparent base film;

a bonding layer placed at least partly on one side of said base film;

wherein said geometric patterned electroconductive material has a line width of 40 μm or less, a line spacing of 200 μm or more, and a line thickness of 40 μm or less; and a difference in refraction index between said transparent base film and said bonding layer is 0.14 or less.

14. Bonding film which has an optically transparent and electromagnetically shielding property according to claim 13, further comprising a bonding agent layer interposed between said transparent base film and said bonding layer, and differences in refraction index between said bonding agent layer and said transparent base film, and between said bonding agent layer and said bonding layer are 0.14 or less.

15. Bonding film which has an optically transparent and electromagnetically shielding property according to claim 13, wherein said transparent film consists of polyethylene-terephthalate film.

16. Bonding film which has an optically transparent and electromagnetically shielding property according to claim 13, wherein said electroconductive material consists of a member selected from a group consisting of copper, aluminum or nickel.

17. Bonding film which has an optically transparent and electromagnetically shielding property according to claim 16, wherein said electroconductive material has a thickness of 3 to 40 μm, and a surface thereof bonded to said transparent film consists of a coarse surface.

18. Bonding film which has an optically transparent and electromagnetically shielding property according to claim 13, wherein said electroconductive material consists of copper which having a darkened surface.

19. Bonding film which has an optically transparent and electromagnetically shielding property according to claim 13, wherein said electroconductive material layer is geometrically patterned by a chemical etching process.

20. Bonding film which has an optically transparent and electromagnetically shielding property according to claim 13, wherein said electroconductive material consists of paramagnetic metallic material.

21. Bonding film which has an optically transparent and electromagnetically shielding property according to claim 13, wherein said bonding film is incorporated with an infrared blocking layer which has an overall infrared absorption ratio of 50% or more in a wavelength range of 900 to 1,100 nm.

22. A display device using the bonding film which has an optically transparent and electromagnetically shielding property according to any one of claims 13 to 21.

23. An electromagnetic shielding assembly using the bonding film which has an optically transparent and electromagnetically shielding property according to any one of claims 13 to 21.

24. An electromagnetic shielding assembly, comprising:

electromagnetic shielding film, wherein said electromagnetic shielding film comprises substantially transparent plastic base film, and geometrically patterned electroconductive material formed at least on one side of said transparent base film, said geometrically patterned material having a line width of 40 μm or less, a line spacing of 200 μm or more, and a line thickness of 40 μm or less; and a pair of substantially transparent base sheets attached to either side of said transparent plastic film, said base sheets having a substantially identical thickness, and wherein a difference in the refraction index between said transparent base sheet and said transparent base film is 0.14 or less.

25. An electromagnetic shielding assembly according to claim 24, wherein said geometric patterned electroconductive material has a line width of 25 μm or less, a line spacing of 500 μm or more, and a line thickness of 18 μm or less.

26. An electromagnetic shielding assembly according to claim 24, wherein said transparent base film consists of polyethylene-terephthalate film.

27. An electromagnetic shielding assembly according to claim 26, wherein said electroconductive material has a thickness of 3 to 18 μm, and a surface thereof bonded to said transparent base film consists of a coarse surface.

28. An electromagnetic shielding assembly according to claim 26, wherein said electroconductive material consists of copper which at least has a darkened surface.

29. An electromagnetic shielding assembly according to claim 24, wherein said electroconductive material consists of a member selected from a group consisting of copper, aluminum and nickel.

30. An electromagnetic shielding assembly according to claim 24, wherein said electroconductive material is geometrically patterned on said transparent base film by a chemical etching process.

31. An electromagnetic shielding assembly according to claim 24, wherein said electroconductive material consists of paramagnetic metallic material.

32. An electromagnetic shielding assembly according to claim 24, further comprising a bonding layer formed at least partly at least on one side of said electromagnetic shielding film.

33. An electromagnetic shielding assembly according to claim 24, wherein said transparent base sheets are made of polymethylmethacrylate (PMMA).

34. A display device using the electromagnetic shielding assembly according to any one of claims 24–33.

35. An electromagnetic shielding assembly, comprising:

a substantially transparent base sheet;

substantially transparent base film placed on each side of said base sheet;

said base film placed at least on one side of said base sheet consisting of electromagnetic shielding film, wherein said electromagnetic shielding film comprises geometrically patterned electroconductive material having a line width of 40 μm or less, a line spacing of 200 μm or more, and a line thickness of 40 μm or less; and a bonding layer for attaching a pair of mutually adjoining members, wherein the difference in the refraction index between said transparent base sheet and said transparent base film 0.14 or less.

36. An electromagnetic shielding assembly according to claim 35, wherein said geometric patterned electroconductive material has a line width of 25 μm or less, a line spacing of 500 μm or more, and a line thickness of 18 μm or less.

37. An electromagnetic shielding assembly according to claim 35, wherein said electroconductive material consists of a member selected from a group consisting of copper, aluminum and nickel.

38. An electromagnetic shielding assembly according to claim 37, wherein said electroconductive material has a thickness of 3 to 18 μm, and a surface thereof bonded to said transparent base film consists of a coarse surface.

39. An electromagnetic shielding assembly according to claim 37, wherein said electroconductive material consists of copper which has a darkened surface.

40. An electromagnetic shielding assembly according to claim 35, wherein said electroconductive material is geometrically patterned on said transparent base film by a chemical etching process.

41. An electromagnetic shielding assembly according to claim 35, wherein said electroconductive material consists of paramagnetic metallic material.

42. An electromagnetic shielding assembly according to claim 35, wherein said base film placed at least on one side of said base sheet comprises an anti-glare or anti-reflective layer.

43. An electromagnetic shielding assembly according to claim 35, wherein said base film placed at least on one side of said base sheet comprises an infrared blocking layer.

44. An electromagnetic shielding assembly according to claim 35, wherein said base film is placed over the two sides of said transparent base sheet by a roll laminating method.

45. An electromagnetic shielding assembly according to claim 35, wherein said transparent base film consists of polyethylene-terephthalate film.

46. An electromagnetic shielding assembly according to claim 35, wherein said transparent base sheet is made of polymethylmethacrylate (PMMA).

47. A display device using the electromagnetic shielding assembly according to any one of claims 35–46.

48. A method for making an electromagnetic shielding bonding film, comprising:

forming geometrically patterned electroconductive material having a line width of 40 $\mu$m or less, a line spacing of 200 $\mu$m or more, and a line thickness of 40 $\mu$m or less over a substantially transparent base film, the geometric pattern providing an aperture ratio of 80% or more, wherein said transparent base film is at least one member selected from the group consisting of polyesters, polyolefins, vinyl resins, polysulfone, polyethersulfone, polycarbonate, polyamide, polyimide and acrylic resins having a visible light transmission factor of 70% or more;

coating a bonding agent composition over a part or an entirety of at least one side of said base film, wherein a difference in the refraction index between said transparent base film and the bonding layer formed by said coated bonding agent is 0.14 or less;

said base film being prepared as a roll web.

49. A method for making electromagnetic shielding bonding film according to claim 48, wherein said transparent base film is at least one member selected from the group consisting of polyethylene terephthalate (PET), polyethylene napthalate, polyethylene, polypropylene, polystyrene, EVA, polyvinyl chloride and polyvinylidene chloride.

50. A method for making electromagnetic shielding bonding film according to claim 49, wherein said transparent base film is at least one member selected from the group consisting of polyethylene terephthalate (PET), polyethylene napthalate, and polyethylene.

51. A method for making electromagnetic shielding bonding film according to claim 50, wherein said transparent base film does not contain a filler.

52. A method for making electromagnetic shielding bonding film according to claim 50, wherein at least most of said steps are carried out in a continuous manner.

* * * * *